US010416574B2

(12) United States Patent
Koevoets et al.

(10) Patent No.: US 10,416,574 B2
(45) Date of Patent: Sep. 17, 2019

(54) LITHOGRAPHIC APPARATUS

(71) Applicant: ASML Netherlands B.V., Veldhoven (NL)

(72) Inventors: Adrianus Hendrik Koevoets, Mierlo (NL); Sander Catharina Reinier Derks, Budel (NL); Franciscus Johannes Joseph Janssen, Geldrop (NL); Jim Vincent Overkamp, Eindhoven (NL); Jacobus Cornelis Gerardus Van Der Sanden, Geldrop (NL)

(73) Assignee: ASML Netherlands B.V, Veldhoven (NL)

( * ) Notice: Subject to any disclaimer, the term of this patent is extended or adjusted under 35 U.S.C. 154(b) by 0 days.

(21) Appl. No.: 15/568,122

(22) PCT Filed: Apr. 4, 2016

(86) PCT No.: PCT/EP2016/057349
§ 371 (c)(1),
(2) Date: Oct. 20, 2017

(87) PCT Pub. No.: WO2016/169758
PCT Pub. Date: Oct. 27, 2016

(65) Prior Publication Data
US 2018/0173116 A1 Jun. 21, 2018

(30) Foreign Application Priority Data

Apr. 21, 2015 (EP) .................................... 15164362
May 22, 2015 (EP) .................................... 15169023
(Continued)

(51) Int. Cl.
G03B 27/52 (2006.01)
G03F 7/20 (2006.01)
(Continued)

(52) U.S. Cl.
CPC ........ *G03F 7/70875* (2013.01); *G03F 7/2041* (2013.01); *G03F 7/70258* (2013.01);
(Continued)

(58) Field of Classification Search
CPC ............... G03F 7/2041; G03F 7/70258; G03F 7/70783; G03F 7/70875; H01L 21/67098; H01L 21/683
See application file for complete search history.

(56) References Cited

U.S. PATENT DOCUMENTS 7,319,505 B2   1/2008 Namba
8,730,448 B2   5/2014 Nienhuys et al.
(Continued)

FOREIGN PATENT DOCUMENTS

JP    S57-149731 A    9/1982

OTHER PUBLICATIONS

International Search Report and Written Opinion of the International Searching Authority directed to related International Patent Application No. PCT/EP2016/057349, dated Aug. 25, 2016; 15 pages.
(Continued)

*Primary Examiner* — Peter B Kim
(74) *Attorney, Agent, or Firm* — Sterne, Kessler, Goldstein & Fox P.L.L.C.

(57) ABSTRACT

A lithographic apparatus comprising a projection system configured to project a patterned radiation beam to form an exposure area on a substrate held on a substrate table, the lithographic apparatus further comprising a cooling apparatus (40) for cooling the substrate, wherein the cooling apparatus comprises a cooling element (42, 44) located above the substrate table and adjacent to the exposure area, the cooling element being configured to remove heat from the substrate.

14 Claims, 13 Drawing Sheets

(30) Foreign Application Priority Data

Oct. 30, 2015 (EP) .................................... 15192297
Dec. 18, 2015 (EP) .................................... 15201030

(51) Int. Cl.
*H01L 21/67* (2006.01)
*H01L 21/683* (2006.01)

(52) U.S. Cl.
CPC .... *G03F 7/70783* (2013.01); *H01L 21/67098*
(2013.01); *H01L 21/683* (2013.01)

(56) References Cited

U.S. PATENT DOCUMENTS

| | | |
|---|---|---|
| 8,810,770 B2 | 8/2014 | Maehara et al. |
| 8,970,818 B2 | 3/2015 | Nienhuys et al. |
| 2003/0176079 A1 | 9/2003 | Sogard |
| 2004/0200226 A1 | 10/2004 | Hara |
| 2004/0256574 A1* | 12/2004 | Namba ............... G03F 7/70875 250/492.1 |
| 2015/0015856 A1 | 1/2015 | Ranjan et al. |

OTHER PUBLICATIONS

International Preliminary Report on Patentability directed to related International Patent Application No. PCT/EP2016/057349, dated Oct. 24, 2017; 9 pages.

\* cited by examiner 0.5 mm distance

LITHOGRAPHIC APPARATUS

CROSS-REFERENCE TO RELATED APPLICATIONS

This application claims priority of EP application 15164362.4 which was filed on Apr. 21, 2015 and from EP application 15169023.7 which was filed on May 22, 2015 and from EP application 15192297.8 which was filed on Oct. 30, 2015 and from EP application 15201030.2 which was filed on Dec. 18, 2015 and from which is incorporated herein in its entirety by reference.

FIELD

The present invention relates to a lithographic apparatus and to a lithographic method.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g. a mask) onto a layer of radiation-sensitive material (resist) provided on a substrate.

The wavelength of radiation used by a lithographic apparatus to project a pattern onto a substrate determines the minimum size of features which can be formed on that substrate. A lithographic apparatus which uses EUV radiation, being electromagnetic radiation having a wavelength within the range 4-20 nm, may be used to form smaller features on a substrate than a conventional lithographic apparatus (which may for example use electromagnetic radiation with a wavelength of 193 nm).

A radiation beam used to project a pattern onto a substrate will deliver a substantial amount of heat to that substrate, and will cause localised heating of the substrate. Localised expansion of the substrate caused by the heating will reduce the accuracy with which a projected pattern overlies patterns already present on the substrate.

SUMMARY

It may be desirable to provide a lithographic apparatus which addresses the problem identified above or some other problem associated with the prior art.

According to a first aspect of the invention there is provided a lithographic apparatus comprising a projection system configured to project a patterned radiation beam to form an exposure area on a substrate held on a substrate table, the lithographic apparatus further comprising a cooling apparatus for cooling the substrate, wherein the cooling apparatus comprises a cooling element located above the substrate table and adjacent to the exposure area, the cooling element being configured to remove heat from a substrate held on the substrate table.

The cooling element may be in thermal communication with the substrate held on the substrate table.

Cooling provided by the cooling element locally suppresses heating in a substrate area close to the exposure area. This is advantageous because heating in that area may be liable to cause substrate expansion which leads to slippage of the substrate over burls of a substrate table, which in turn will reduce the accuracy with which patterns are projected onto the substrate.

The cooling element may be configured to cool an area which lies within 3 cm or less from a line which bisects the exposure area.

The cooling element may be configured to cool an area which lies within 2 cm or less from an edge of the exposure area.

The cooling element may be separated from the exposure area in a direction which substantially corresponds with a scanning direction of the lithographic apparatus.

The cooling element may be one of a pair of cooling elements provided either side of the exposure area.

The cooling element may comprise a body, an open cavity being provided in a lowermost face of the body, and further comprises a gas delivery conduit configured to deliver gas to the cavity. The gas conduit allows controlling the pressure within the cavity of the cooling element.

The cavity may be configured to form, together with an upper surface of the substrate, a volume which receives gas delivered by the gas delivery conduit.

The extent of a cavity of the cooling element in a non-scanning direction of the lithographic apparatus may be equal to or greater than the maximum exposure area length of the lithographic apparatus in the non-scanning direction.

The cavity may have a roof which is less than 1 mm from the upper surface of the substrate in use.

The roof of the cavity may be substantially parallel to a plane of the substrate table.

The combination of the pressure of gas delivered to the cavity and the separation between the cavity roof and the substrate surface may be such that the accommodation coefficient of the substrate does not have a significant effect upon transfer of heat from the substrate to the cooling element body.

The roof of the cavity may be sloping, the roof being tilted about an axis which runs transverse to a scanning direction of the lithographic apparatus.

The cooling element may comprise a body containing a chamber connected to a gas delivery conduit, a floor of the chamber being provided with openings.

The openings in the floor of the chamber may comprise an array of holes.

The floor of the chamber may be formed from porous material, and the openings may be pores of the porous material.

The cooling element may further comprise at least one shutter which is moveable from a retracted position to a deployed position, and wherein moving the shutter from the retracted position to the deployed position closes some openings in the floor of the cooling element.

The at least one shutter may be configured such that no openings are closed by the shutter when the shutter is in the retracted position.

The at least one shutter may be moveable to an intermediate position which is between the retracted position and the deployed position.

The cooling element may comprise additional chambers provided either side of the chamber, the additional chambers being connected to a different gas delivery conduit or conduits.

The lithographic apparatus may further comprise a valve configured to control delivery of gas to the chamber, and one or more valves configured to separately control delivery of gas to the additional chambers.

The body of the cooling element may have a thickness of 3 mm or less.

The body of the cooling element may be located 3 mm or less from an edge of the exposure area.

The body of the cooling element may have a lowermost surface which measures less than 5 mm in a scanning direction of the lithographic apparatus.

The body of the cooling element may have a sloping inner surface which faces towards the radiation beam.

The cooling element may include a heat removal system configured to remove heat from the cooling element.

The heat removal system may be a fluid cooling system.

The heat removal system may include a Peltier cooler. The Peltier cooler may be located between the fluid cooling system and the cavity.

The fluid cooling system may comprise a cooler configured to cool gas, the cooler being located remotely from the cooling element, an inlet conduit configured to deliver the cooled gas to the cooling element in order to cool the cooling element, and an outlet conduit configured to remove the gas from the cooling element.

The inlet conduit and the outlet may both include a flexible portion which accommodates movement of the cooling element.

A temperature sensor may be provided on the inlet conduit and a temperature sensor may be provided on the outlet conduit.

The apparatus may further comprise a gas source configured to provide the gas at a rate of more than 10 l/min.

The apparatus may further comprise a gas source configured to provide the gas at a rate of less than 2l/min.

The heat removal system may comprise a heat pipe connected to a cooler.

The heat pipe may have a cross-sectional shape which is larger in a horizontal direction than in the vertical direction.

The heat pipe may include a flexible portion which accommodates movement of the cooling element.

The heat pipe may be a micro heat pipe.

The fluid cooling system may be a two-phase cooling system which comprises a pump, a condenser and an accumulator.

The two-phase cooling system may further comprise a temperature sensor provided on the cooling element.

The fluid cooling system may include a constriction provided in a heat exchanger, the constriction being configured to cool gas which is used to cool the cooling element.

The cooling element may be provided with a heater.

A Peltier cooler may be located between the fluid cooling system and the cavity.

The lithographic apparatus may further comprise a gas supply configured to deliver gas at a pressure of 200 Pascals or more. The gas supply may be configured to deliver gas at a pressure of 100 kPa or more. The gas supply may be configured to deliver gas at a pressure of around 500 kPa or more. Although any pressure may be suitable for heat removal, by increasing the gas pressure the gas density will be increased accordingly and at higher gas density the heat can be removed more efficiently.

The cooling element may be configured to have a separation of 20 microns or more from the substrate during use.

The cooling element may be configured to have a separation of 200 microns or less from the substrate during use.

The cooling element may be configured to provide an outward flow of gas from underneath the cooling element that acts as a cushion which prevents or inhibits contact occurring between the cooling element and the substrate.

The cooling element may be provided on a support which includes a retraction mechanism which is configured to pull the cooling element away from the substrate if unexpected movements are detected.

The cooling element may comprise an array of nozzles arranged to direct droplets of liquid onto the substrate.

The cooling element may be configured to have a separation of 50 microns or more from the substrate during use.

The cooling element may be configured to have a separation of 1 millimeter or more from the substrate during use.

The extent of the array of nozzles of the cooling element in a non-scanning direction of the lithographic apparatus may be equal to or greater than the maximum exposure area length of the lithographic apparatus in the non-scanning direction.

The array of nozzles may be a two dimensional array in which the nozzles are evenly distributed across a bottom surface of the cooling element.

The nozzles may be configured to provide liquid droplets with a diameter of the order of tens of microns or less.

According to a second aspect of the invention there is provided a lithographic method comprising projecting a patterned radiation beam to form an exposure area on a substrate held on a substrate table, and using a cooling apparatus to cool the substrate, the cooling apparatus comprising a cooling element located above the substrate table and adjacent to the exposure area, the cooling element acting to remove heat from the substrate.

The cooling element may be in thermal communication with the substrate held on the substrate table.

The cooling element may be configured to cool an area which lies within 3 cm or less from a line which bisects the exposure area.

The cooling element may be configured to cool an area which lies within 2 cm or less from an edge of the exposure area.

The cooling element may comprise a body, an open cavity provided in a lowermost face of the body, the open cavity and the upper surface of the substrate forming a volume, and a gas delivery conduit configured to deliver gas to the volume.

The cavity may have a roof which is less than 1 mm from the upper surface of the substrate.

The cooling element may comprise a body containing a chamber connected to a gas delivery conduit, a floor of the chamber being provided with openings.

The gas may be delivered to the volume at a pressure of 200 Pascals or more. The gas may be delivered to the volume at a pressure of 100 kPa or more. The gas may be delivered to the volume at a pressure of around 500 kPa or more.

The cooling element may be separated from the substrate by 20 microns or more.

The cooling element may be separated from the substrate by 200 microns or less.

The cooling element may comprise an array of nozzles which direct droplets of liquid onto the substrate.

The cooling element may be separated from the substrate by of 50 microns or more.

The cooling element may be separated from the substrate by 1 mm or more.

The extent of the array of nozzles of the cooling element in a non-scanning direction of the lithographic apparatus may be equal to or greater than the maximum exposure area length of the lithographic apparatus in the non-scanning direction.

The array of nozzles may be arranged to provide an even distribution of liquid droplets on the substrate.

The liquid may be water.

According to a third aspect of the invention there is provided a lithographic apparatus comprising a projection system configured to project a patterned radiation beam onto a substrate held on a substrate table, the lithographic apparatus further comprising a substrate temperature adjustment unit configured to adjust the temperature of the substrate to a temperature above the temperature of the substrate table before the substrate is placed on the substrate table.

This is advantageous because the substrate then cools to the temperature of the substrate table when it is placed upon the substrate table, thereby introducing a stress into the substrate. The stress which is introduced into the substrate tends to draw an outer edge of the substrate inwards towards the centre of the substrate. When the substrate is patterned using a radiation beam this heats the substrate and introduces stress which tends to push an outer edge of the substrate outwards away from the centre of the substrate. The stress already introduced during cooling of substrate will at least partially counteract the stress caused by heating of the substrate, thereby reducing the cumulative stress experienced by the substrate.

The substrate temperature adjustment unit may be configured to adjust the temperature of the substrate to a temperature which is up to around 0.5° C. above the temperature of the substrate table.

According to a fourth aspect of the invention there is provided a method of conditioning a substrate prior to exposure of that substrate in a lithographic apparatus, the method comprising using a temperature adjustment unit to adjust the temperature of the substrate to a temperature which is above the temperature of a substrate table of the lithographic apparatus, transferring the substrate to the substrate table and activating a clamp which clamps the substrate to the substrate table, cooling the substrate to the temperature of the substrate table and thereby inducing a stress into the substrate.

According to fifth aspect of the invention there is provided a scanning lithographic apparatus comprising a projection system configured to project a patterned radiation beam to form an exposure area on a substrate held on a substrate table, the lithographic apparatus further comprising a heating apparatus for heating the substrate, wherein the heating apparatus comprises first and second heating elements configured to heat substrate areas located at opposite ends of the exposure area in a non-scanning direction of the lithographic apparatus.

The heating apparatus is advantageous because it prevents or reduces distortion of the substrate at the ends of the exposure area in the non-scanning direction. This allows the overlay performance of the lithographic apparatus to be improved.

The first and second heating elements may be located above the substrate table and located at opposite ends of the exposure area in a non-scanning direction of the lithographic apparatus.

The first and second heating elements may be adjacent to the exposure area in the non-scanning direction.

The first and second heating elements may be configured to heat areas which overlap in the non-scanning direction with the exposure area.

The first and second heating elements may be configured to emit heat with some outward divergence such that areas which receive heat extend beyond the footprints of the heating elements.

The first and second heating elements may be configured to heat areas which have a size in the scanning direction that generally corresponds with the size in the scanning direction of the exposure area.

The first and second heating elements may each be configured to heat areas which have a size in the non-scanning direction that is less than the size in non-scanning direction of the exposure area.

The first and second heating elements may be configured to heat areas which have a size in the non-scanning direction that is less than half the size in non-scanning direction of the exposure area.

The heating area may also have a size in the scanning direction that is larger than that of the exposure area. The heating in the heating area does not need to be uniform.

The heating elements may each comprise an array of LEDs.

The LEDs may be configured to emit infrared radiation.

At least some of the LEDs may be configured to emit radiation beams which diverge such that they overlap with the patterned radiation beam before they are incident upon the substrate.

The first and second heating elements may comprise one or more lasers configured to provide laser beams which heat the substrate areas located at opposite ends of the exposure area in the non-scanning direction of the lithographic apparatus.

The one or more lasers and associated optics may be configured such that the laser beams pass out of an opening located in a floor of a projection system housing of the lithographic apparatus before being incident upon the substrate.

The one or more lasers may be located outside of a projection system housing of the lithographic apparatus.

The projection system housing may be provided with a window which allows the laser beams to pass into the projection system housing.

The scanning lithographic apparatus may further comprise mirrors mounted on actuators within the projection system housing, the mirrors being operable to change the directions of the laser beams and thereby move the substrate areas which are heated by the laser beams to different positions.

The scanning lithographic apparatus may further comprise a cooling element located above the substrate table and located at one side of the exposure area in a scanning direction of the lithographic apparatus.

The scanning lithographic apparatus may further comprise an additional cooling element located above the substrate table and located at an opposite side of the exposure area in a scanning direction of the lithographic apparatus.

According to a sixth aspect of the invention there is provided a method of exposing a substrate using a scanning lithographic apparatus, the method comprising projecting a patterned radiation beam to form an exposure area on a substrate held on a substrate table, using a heating apparatus to heat areas on the substrate which are located at opposite ends of the exposure area in a non-scanning direction of the lithographic apparatus, and moving the substrate relative to the exposure area and heated areas in a scanning movement in order to expose a target portion of the substrate using the patterned radiation beam. The consecutive portion to be exposed may also be adjacent to the exposed portion in the scanning direction.

The next target portion which is exposed may be not adjacent to the exposed target portion in the non-scanning direction, but instead separated from the exposed target portion in the non-scanning direction by at least one interposed target portion.

The method may further comprises using a cooling apparatus to cool an area on the substrate which is located adjacent to at least one side of the exposure area in a scanning direction of the lithographic apparatus.

BRIEF DESCRIPTION OF THE DRAWINGS

Embodiments of the invention will now be described, by way of example only, with reference to the accompanying schematic drawings, in which.

DETAILED DESCRIPTION

Figure 1:
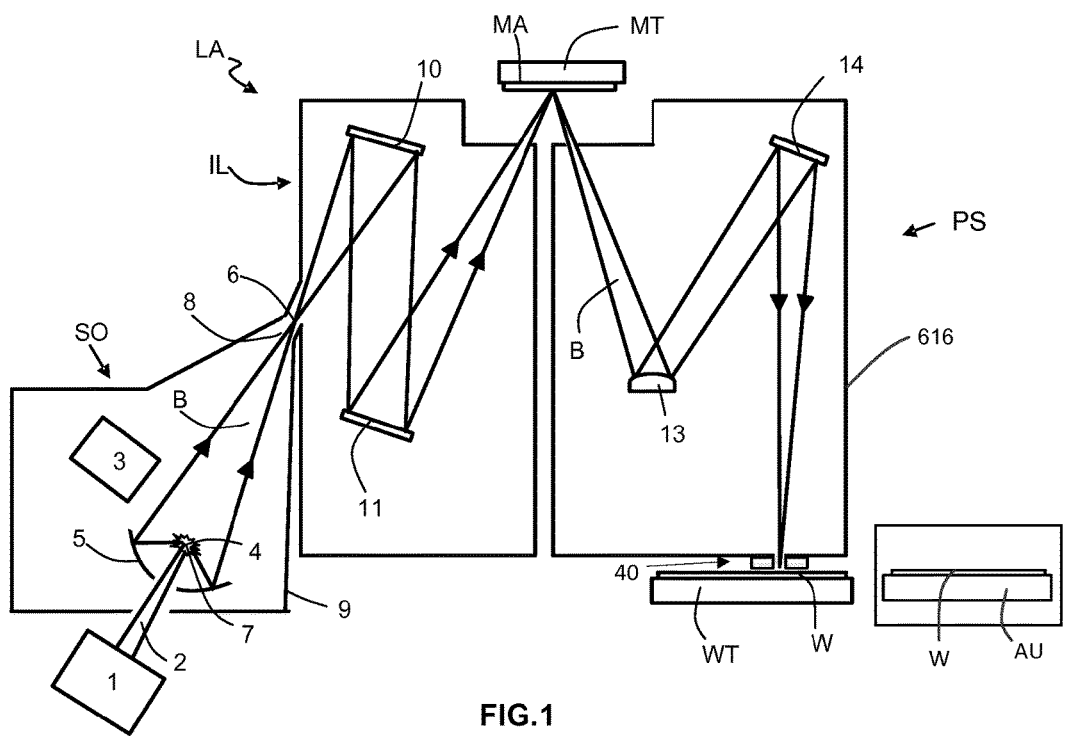
FIG. 1 schematically depicts a lithographic system comprising a lithographic apparatus and a radiation source according to an embodiment of the invention.

FIG. 1 shows a lithographic system including a cooling apparatus according to an embodiment of the invention. The lithographic system comprises a radiation source SO and a lithographic apparatus LA. The radiation source SO is configured to generate an extreme ultraviolet (EUV) radiation beam B. The lithographic apparatus LA comprises an illumination system IL, a support structure MT configured to support a patterning device MA (e.g. a mask), a projection system PS and a substrate table WT configured to support a substrate W. The illumination system IL is configured to condition the radiation beam B before it is incident upon the patterning device MA. The projection system is configured to project the radiation beam B (now patterned by the mask MA) onto the substrate W. The substrate W may include previously formed patterns. Where this is the case, the lithographic apparatus aligns the patterned radiation beam B with a pattern previously formed on the substrate W.

The radiation source SO, illumination system IL, and projection system PS may all be constructed and arranged such that they can be isolated from the external environment. A gas at a pressure below atmospheric pressure (e.g. hydrogen) may be provided in the radiation source SO. A vacuum may be provided in illumination system IL and/or the projection system PS. A small amount of gas (e.g. hydrogen) at a pressure well below atmospheric pressure may be provided in the illumination system IL and/or the projection system PS.

The radiation source SO shown in FIG. 1 is of a type which may be referred to as a laser produced plasma (LPP) source). A laser 1, which may for example be a $CO_2$ laser, is arranged to deposit energy via a laser beam 2 into a fuel, such as tin (Sn) which is provided from a fuel emitter 3. Although tin is referred to in the following description, any suitable fuel may be used. The fuel may for example be in liquid form, and may for example be a metal or alloy. The fuel emitter 3 may comprise a nozzle configured to direct tin, e.g. in the form of droplets, along a trajectory towards a plasma formation region 4. The laser beam 2 is incident upon the tin at the plasma formation region 4. The deposition of laser energy into the tin creates a plasma 7 at the plasma formation region 4. Radiation, including EUV radiation, is emitted from the plasma 7 during de-excitation and recombination of ions of the plasma.

The EUV radiation is collected and focused by a near normal incidence radiation collector 5 (sometimes referred to more generally as a normal incidence radiation collector). The collector 5 may have a multilayer structure which is arranged to reflect EUV radiation (e.g. EUV radiation having a desired wavelength such as 13.5 nm). The collector 5 may have an elliptical configuration, having two ellipse focal points. A first focal point may be at the plasma formation region 4, and a second focal point may be at an intermediate focus 6, as discussed below.

The laser 1 may be separated from the radiation source SO. Where this is the case, the laser beam 2 may be passed from the laser 1 to the radiation source SO with the aid of a beam delivery system (not shown) comprising, for example, suitable directing mirrors and/or a beam expander, and/or other optics. The laser 1 and the radiation source SO may together be considered to be a radiation system.

Radiation that is reflected by the collector 5 forms a radiation beam B. The radiation beam B is focused at point 6 to form an image of the plasma formation region 4, which acts as a virtual radiation source for the illumination system IL. The point 6 at which the radiation beam B is focused may be referred to as the intermediate focus. The radiation source SO is arranged such that the intermediate focus 6 is located at or near to an opening 8 in an enclosing structure 9 of the radiation source.

The radiation beam B passes from the radiation source SO into the illumination system IL, which is configured to condition the radiation beam. The illumination system IL may include a facetted field mirror device 10 and a facetted pupil mirror device 11. The faceted field mirror device 10 and faceted pupil mirror device 11 together provide the radiation beam B with a desired cross-sectional shape and a desired angular distribution. The radiation beam B passes from the illumination system IL and is incident upon the patterning device MA held by the support structure MT. The patterning device MA reflects and patterns the radiation beam B. The illumination system IL may include other mirrors or devices in addition to or instead of the faceted field mirror device 10 and faceted pupil mirror device 11.

Following reflection from the patterning device MA the patterned radiation beam B enters the projection system PS. The projection system comprises a plurality of mirrors which are configured to project the radiation beam B onto a substrate W held by the substrate table WT. The projection system PS may apply a reduction factor to the radiation beam, forming an image with features that are smaller than corresponding features on the patterning device MA. A reduction factor of 4 may for example be applied. Although the projection system PS has two mirrors in FIG. 1, the projection system may include any number of mirrors (e.g. six mirrors).

A cooling apparatus 40 is located above the substrate W. The cooling apparatus 40 provides localised cooling of the substrate in the vicinity of the radiation beam B. The cooling apparatus 40 is described in detail further below. A substrate temperature adjustment unit AU configured to heat a substrate W is also depicted in FIG. 1. The temperature adjustment unit AU is described in detail further below. The lithographic apparatus LA may further comprise a heating apparatus (not depicted) which is described further below.

Figure 2:
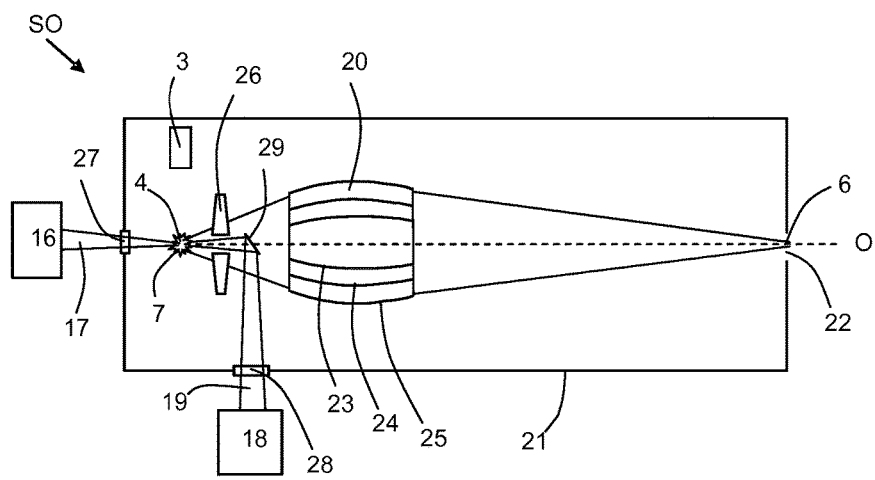
FIG. 2 schematically depicts a radiation source of the lithographic apparatus.

FIG. 2 shows a laser produced plasma (LPP) radiation source SO which has an alternative configuration to the radiation source shown in FIG. 1. The radiation source SO includes a fuel emitter 3 which is configured to deliver fuel to a plasma formation region 4. The fuel may for example be tin, although any suitable fuel may be used. A pre-pulse laser 16 emits a pre-pulse laser beam 17 which is incident upon the fuel. The pre-pulse laser beam 17 acts to preheat the fuel, thereby changing a property of the fuel such as its size and/or shape. A main laser 18 emits a main laser beam 19 which is incident upon the fuel after the pre-pulse laser beam 17. The main laser beam delivers energy to the fuel and thereby coverts the fuel into an EUV radiation emitting plasma 7.

A radiation collector 20, which may be a so-called grazing incidence collector, is configured to collect the EUV radiation and focus the EUV radiation at a point 6 which may be referred to as the intermediate focus. Thus, an image of the radiation emitting plasma 7 is formed at the intermediate focus 6. An enclosure structure 21 of the radiation source SO includes an opening 22 which is at or near to the intermediate focus 6. The EUV radiation passes through the opening 22 to an illumination system of a lithographic apparatus (e.g. of the form shown schematically in FIG. 1).

The radiation collector 20 may be a nested collector, with a plurality of grazing incidence reflectors 23, 24 and 25 (e.g. as schematically depicted). The grazing incidence reflectors 23, 24 and 25 may be disposed axially symmetrically around an optical axis O. The illustrated radiation collector 20 is shown merely as an example, and other radiation collectors may be used.

A contamination trap 26 is located between the plasma formation region 4 and the radiation collector 20. The contamination trap 26 may for example be a rotating foil trap, or may be any other suitable form of contamination trap. In some embodiments the contamination trap 26 may be omitted.

An enclosure 21 of the radiation source SO includes a window 27 through which the pre-pulse laser beam 17 can pass to the plasma formation region 4, and a window 28 through which the main laser beam 19 can pass to the plasma formation region. A mirror 29 is used to direct the main laser beam 19 through an opening in the contamination trap 26 to the plasma formation region 4.

The radiation sources SO shown in FIGS. 1 and 2 may include components which are not illustrated. For example, a spectral filter may be provided in the radiation source. The spectral filter may be substantially transmissive for EUV radiation but substantially blocking for other wavelengths of radiation such as infrared radiation.

Figure 3A:
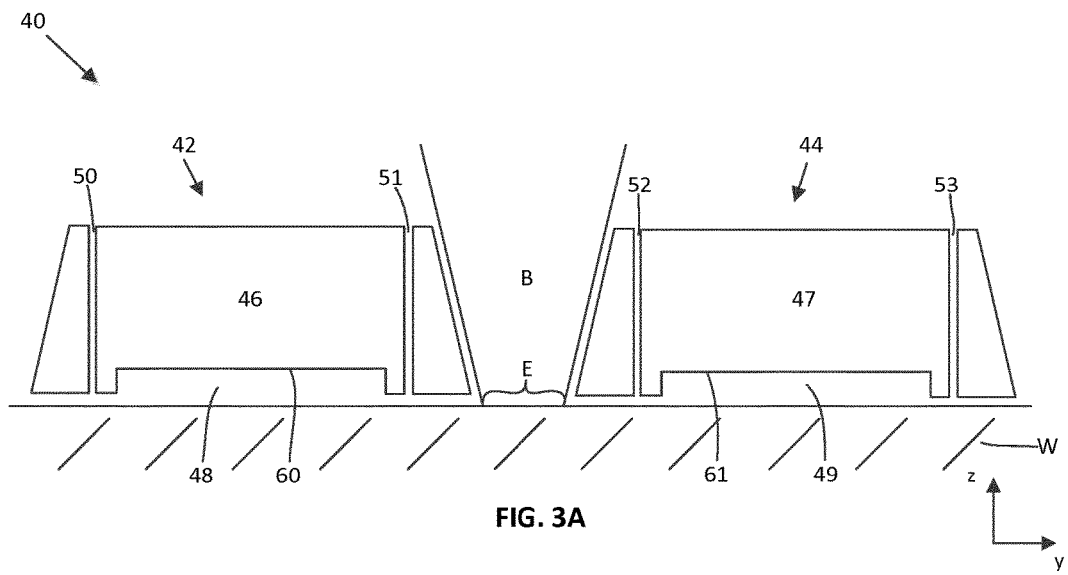
FIGS. 3A-3B schematically depict a cooling apparatus of the lithographic apparatus in cross section viewed from one side and viewed from below.
Figure 3B:
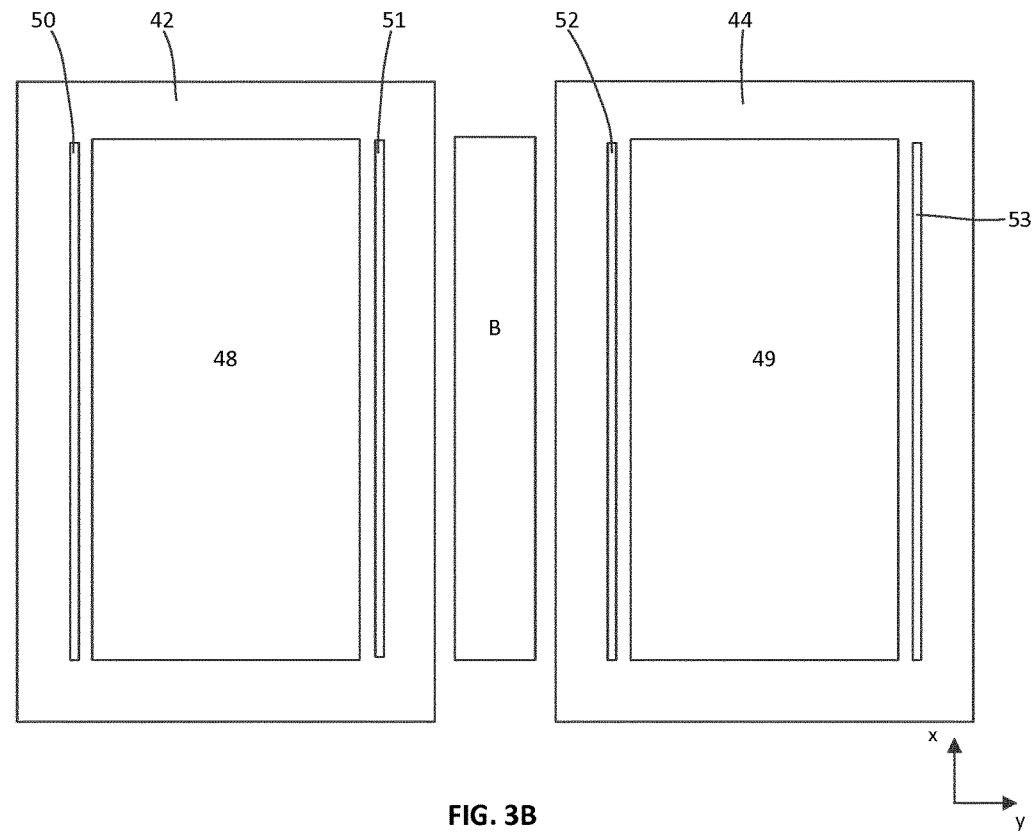

FIG. 3 schematically depicts a cooling apparatus 40 according to an embodiment of the invention. FIG. 3a is a schematic view of the cooling apparatus 40 viewed from below, and FIG. 3b is a schematic view of the cooling apparatus in cross-section viewed from one side. The radiation beam B projected by the lithographic apparatus is shown in FIGS. 3a and 3b. The radiation beam illuminates an exposure area E on a substrate W which is being exposed by the radiation beam (as depicted in FIG. 3b). Cartesian coordinates are shown in FIG. 3, and use the notation which is conventionally used for lithographic apparatus, i.e. the Y-direction is the direction of scanning movement of the substrate W during exposure, the X-direction is transverse to the Y-direction and lies in the plane of the substrate, and the Z-direction generally corresponds with the optical axis of the radiation beam B.

The cooling apparatus 40 comprises a first cooling element 42 and a second cooling element 44. As depicted in FIG. 3 the first and second cooling elements may have the same overall construction. The cooling elements 42, 44 are located either side of the radiation beam B in the scanning-direction (i.e. in the Y-direction). The cooling elements 42, 44 are adjacent to an exposure area E (i.e. an area upon which the radiation beam B is incident). In this context the term "adjacent" may be interpreted as meaning less than 1 cm from an edge of the exposure area E. The cooling elements 42, 44 may be less than 0.5 cm from an edge of the exposure area E, and may be around 0.1 cm from an edge of the exposure area. Each cooling element 42, 44 may be configured to cool an area which lies within 3 cm or less from a line which bisects the exposure area E. Each cooling element 42, 44 may be configured to cool an area which lies within 2 cm or less from an edge of the exposure area.

The cooling elements 42, 44 provide localised cooling of the substrate W in areas which lie beneath the cooling elements. Thus, during a scanning exposure of the substrate in which the substrate is moving in the positive Y-direction (from left to right in FIG. 3) the first cooling element 42 cools part of the substrate that is about to be exposed by the radiation beam B and the second cooling element 44 cools part of the substrate that has just been exposed by the radiation beam B. If the scanning exposure moves the substrate in the negative Y-direction (from right to left in FIG. 3) then the second cooling element 44 provides cooling of part of the substrate that is about to be exposed by the radiation beam B and the first cooling element 42 provides cooling of part of the substrate that has just been exposed by the radiation beam.

Each cooling element 42, 44 is configured to receive heat from the substrate W and to transfer that heat to some other location, for example using a cooling fluid (e.g. water). In this context the term "cooling fluid" is not intended to imply that the fluid must have a particular temperature but instead indicates that the fluid transports heat away from the cooling element 42, 44. Each cooling element 42, 44 comprises a body 46, 47 in which a cavity 48, 49 is formed with a roof 60, 61. The cavity 48, 49 is formed in a lowermost surface of the cooling element body 46, 47 and is located above the substrate W in use. Each cooling element 42, 44 further comprises gas delivery conduits 50-53 which are configured to deliver gas to the lowermost surface of the cooling element bodies 46, 47. Gas which exits the gas delivery conduits 50-53 passes into the cavities 48, 49 and fills the cavities. Gas also travels outwardly and exits from beneath the cooling element bodies 46, 47 to the surrounding environment.

The gas is delivered at a pressure which is sufficiently high to transport a significant amount of heat from the substrate W to the cooling element bodies 46, 47. The pressure of the gas may be kept sufficiently low that the gas does not cause damage to the substrate W. Furthermore, the pressure of the gas may be kept sufficiently low that it does not generate tangential forces sufficiently strong to cause the substrate W to slip over burls on the substrate table WT (e.g. does not generate tangential forces greater than around 10 mN). The pressure of the gas may be kept sufficiently low that significant deformation of the substrate W does not occur at locations where the substrate is supported by burls of the substrate table WT. The substrate may have an outer edge of for example 1-3 mm which is not supported by burls of the substrate table WT. The pressure of the gas may be sufficiently low that downward deformation of the substrate at the outer edge is limited to an amount which can be compensated for by the lithographic apparatus (e.g. deformation of less than 10 nm). The pressure of the gas in the cavities 48, 49 may for example be greater than 100 Pascals. The pressure of the gas in the cavities 48, 49 may for example be greater than 200 Pascals. The pressure of gas in the cavities may for example be up to around 1000 Pascals, may be up to around 2000 Pascals, and may be up to around 5000 Pascals. The pressure of gas in the cavities may for example be 100 kPa or more. The pressure of gas in the cavities may for example be around 500 kPa or more. The pressure of the gas in the cavities 48, 49 will be affected by the gap between the lowermost surface of the body 46, 47 and the substrate W (increasing the gap will make it more difficult to maintain a high pressure). As explained elsewhere in this document, the separation may for example be around 20 microns or more, and may be around 50 microns or more. The separation may be around 200 microns or less.

In addition to facilitating transport of heat from the substrate W to the cooling element bodies 46, 47 the gas may also act as a cushion which prevents or inhibits contact occurring the between the cooling element bodies and the substrate W. In an embodiment, a separation between a lowermost surface of the cooling element bodies 46, 47 and the substrate W may be greater than 20 microns, and may for example be 50 microns or more. If the separation is too small then there will be a significant risk of a cooling element body 46, 47 coming into contact with a substrate W. This is undesirable because it may cause damage to the lithographic apparatus. A separation of 20 microns may be sufficient to reduce the risk of contact to a reasonable level. A separation of 50 microns may be sufficient to substantially eliminate the risk of contact. The separation may for example be up to 100 microns, and may for example be up to 200 microns. A separation greater than 200 microns may be undesirable because it may allow a too much gas to leak out from underneath the cooling element bodies 46, 47.

Figure 4:
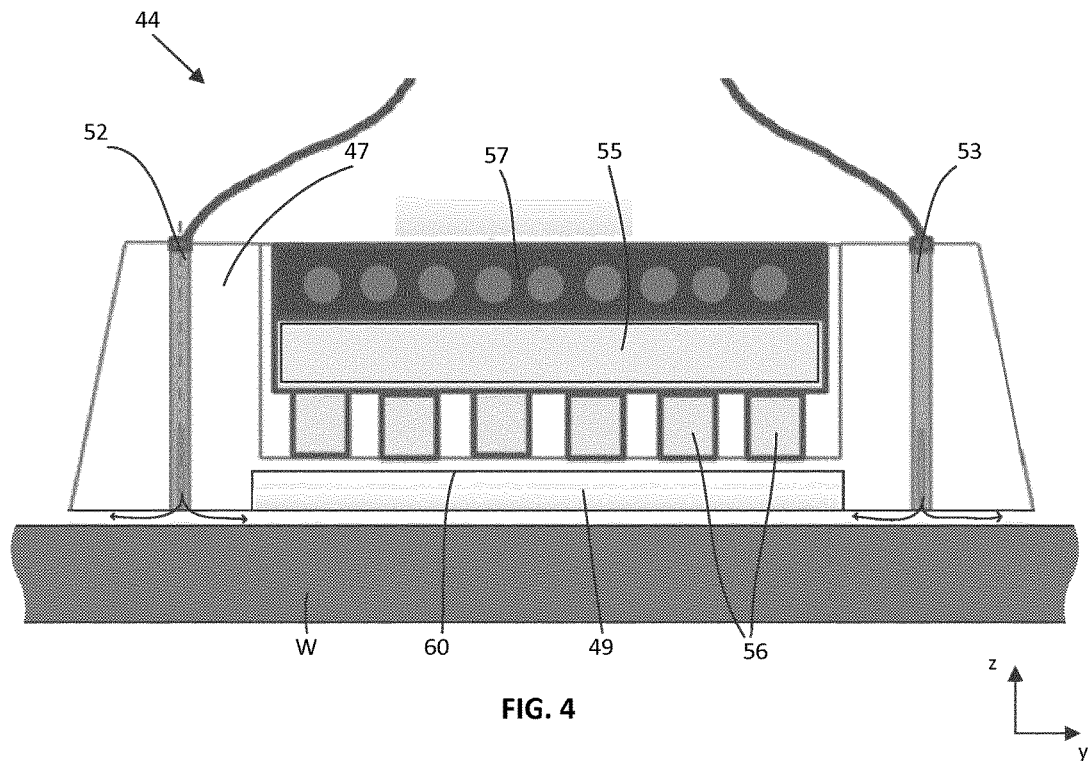
FIG. 4 schematically depicts the cooling apparatus in more detail.

FIG. 4 depicts the second cooling element 44 in more detail. The cavity 49 in the cooling element body 47 can be seen, as can the gas delivery conduits 52, 53. As depicted by arrows in FIG. 4, gas delivered by the gas delivery conduits 52, 53 flows into the cavity 49 and also flows out from underneath the cooling element body 47. Gas is provided from gas supplies which are schematically depicted by curved lines. The gas may for example be hydrogen. Alternatively, any other suitable gas may be used (e.g. another inert gas such as helium or nitrogen).

The second cooling element 44 includes a heat transfer system which is provided in two parts. The first part is a Peltier cooler 55 which is in thermal contact with a portion of the cooling element body 47 located above the cavity 49. Thermal contact between the Peltier cooler 55 and the second cooling element body 47 is provided by an array of thermoelectric elements 56. The thermoelectric elements 56 may be connected electrically in series in a known manner. The second part of the heat transfer system is a cooling fluid system 57 which is in thermal contact with the Peltier cooler 55. The cooling fluid system 57 is an example of a heat removal system. The cooling fluid system 57 comprises a conduit (or conduits) through which cooling fluid is pumped. The cooling fluid may for example be water (or some other suitable fluid). The cooling fluid receives heat from the body of the system 57 and carries that heat away from the second cooling element 44. A cold side of the Peltier cooler (i.e. at distal ends of the thermoelectric elements 56) may for example have a temperature of between around −18° C. and 2° C. The cold side of the Peltier cooler may for example have a temperature of −50° C. or as low as −100° C.

The temperature of the gas as it is introduced from the gas delivery conduits 50-53 may be adapted to the temperature of walls of the gas delivery conduits, for example around 22° C. When the gas is in the cavities it will adapt to the temperatures of the substrate and the Peltier cooler 55. Thus, the gas may for example have a temperature of between around 22° C. (the temperature of the substrate W) and around −50° C. In general, the gas may have a temperature down to for example around −100° C. In general, the gas may have a temperature up to for example around 100° C.

In an embodiment, the X-direction extent of the cavity 49 of the cooling element body 47 may correspond with the maximum X-direction extent of an exposure area E formed by the radiation beam B of the lithographic apparatus. This may for example be 26 mm. Thus, the cavity 49 may have an X-direction extent of around 26 mm By providing the cavity 49 with an X-direction extent which is equal to the X-direction extent of the exposure area E, the cavity 49 is able to provide cooling across the substrate area which is about to be exposed by the radiation beam or which has just been exposed by the radiation beam (depending on the scanning direction of travel of the substrate W). The consecutive portion to be exposed may also be adjacent to the exposed portion in the scanning direction.

The X-direction extent of the cavity 49 may be greater than the maximum X-direction extent of an exposure area E formed by the radiation beam B. Thus, the cavity 49 may have an X-direction extent of around 26 mm or more. However, where the X-direction extent of the cavity 49 extends significantly beyond the exposure area E, the cavity will cool part of an adjacent target portion on the substrate W in addition to cooling a target portion which is being exposed. This may cause distortion of the partially cooled adjacent target portion. A potential reduction of overlay accuracy which may be caused by this distortion may be avoided by exposing a substrate using a meander scan in which the next target portion which is exposed is not adjacent to the exposed target portion in the non-scanning direction, but instead is separated from the exposed target portion in the non-scanning direction by at least one interposed target portion (e.g. as described further below with reference to FIG. 20).

In an embodiment, the second cooling element body 47 may for example have a width in the Y-direction of between around 1 cm and around 3 cm (e.g. around 2 cm). The second cooling element body 47 may for example have a height (Z-direction dimension) of between around 2 mm and around 7 mm.

The second cooling element may be configured to cool an area which lies within 3 cm or less from a line which bisects the exposure area E (e.g. from the centre of the exposure area). The second cooling element may be configured to cool an area which lies within 2 cm or less from an edge of the exposure area E. Heating of the substrate by radiation delivered to the exposure area drops off as a function of distance from the edge of the exposure area. Beyond around 2 cm from the edge of the exposure area heating of the substrate may be negligible. Thus, cooling an area which lies within around 2 cm from the edge of the exposure area will provide a reduction of the substrate temperature (thereby reducing distortion of the substrate). Cooling an area which extends significantly beyond this will provide a negligible benefit (and would be more difficult to achieve because a larger volume of gas would be needed).

Embodiments of the invention provide localised cooling of the substrate W in a manner not contemplated by the prior art. Embodiments of the invention may prevent localised heating of the substrate occurring to such an extent that significant slippage of the substrate over burls of the substrate table occurs. Improved removal of heat from the substrate W (and thus avoiding burl-slip) may be particularly important when the dose of energy delivered to the substrate is increased relative to a conventionally delivered dose. For example, improving the resolution (e.g. half pitch) of a projected pattern to, for example, 7 nanometers may require an increase of the radiation dose delivered to the substrate (compared with the radiation dose used for a resolution of 15 nanometers).

The separation between the roof 60, 61 of each cavity 48, 49 and the substrate surface, in combination with the pressure of the gas in the cavity, may be selected such that the transfer of heat from the substrate W to the cooling element body 46, 47 is not significantly affected by the accommodation coefficient of the surface of the substrate (which in practice will be the surface of resist provided on the substrate). If the height of the cavity roof 60, 61 and the gas pressure in combination were such that the accommodation coefficient had a significant influence on the heat transfer, then the cooling provided by the cooling elements 42, 44 would vary depending upon properties of the resist on the substrate W which may be unknown. This is undesirable because the cooling which is provided by the cooling elements 42, 44 would then be unknown. As a result it might not be possible to control the temperature of the substrate W with a desired accuracy, or to control the thermal load applied to the substrate with a desired accuracy.

The extent to which the accommodation coefficient of a material has an effect upon the transfer of heat from the surface of that material to another body depends upon the separation between the material surface and the body and the pressure of the gas via which the heat exchange may take place. If the separation is sufficiently small and the gas pressure is sufficiently low then the accommodation coefficient will have a significant effect upon the heat transfer. This is because a given gas molecule will not immediately adapt to the temperature of a material when it is incident upon and reflected from the surface of that material. Typically, around 30% of gas molecules will adapt to the temperature of material. However, this will vary for different materials according to the accommodation coefficient. If the body is sufficiently close to the surface of the material, and the gas pressure is sufficiently low, then there is a significant chance that a gas molecule will be incident upon the surface of the material and then incident upon the body without any further interactions (i.e. without being incident upon the material surface again and without colliding with other gas molecules). In such a circumstance, the heat transfer which occurs will depend upon the accommodation coefficient of the material surface. Increasing the pressure of the gas will cause more interactions between gas molecules to take place before a gas molecule is incident upon the body, and as a result of this gas molecules in the vicinity of the material surface are more likely to adapt to the temperature of the material surface. Similarly, moving the body further away from the material surface will also increase the number of molecule-molecule interactions which take place before gas molecules are incident upon the body. Again, this helps to ensure that the molecules adapt to the temperature of the material surface before they are incident upon the body. Thus, the influence of the accommodation coefficient reduces as the gas pressure is increased and as the separation between the material surface and the body is increased. If the pressure and separation are sufficiently large (in combination) then the accommodation coefficient will not have a significant effect upon the heat transfer. This may be referred to as the normal-pressure regime (as explained further below in connection with FIG. 6).

In the present case the separation between the substrate surface and the roof 60, 61 of the cavity 48, 49 in combination with the pressure of the gas in the cavity may be such that the accommodation coefficient does not have a significant effect upon the heat transfer. That is, the cooling element 42, 44 operates in the normal-pressure regime. Providing gas at a pressure of around 1,000 Pascals and a separation between the substrate W (i.e. resist upper surface) and the cavity roof 60 of 0.5 mm will ensure that the accommodation coefficient of the resist does not have a significant effect upon the transfer of heat from the resist to the cooling element 42. In another example, providing a separation between the substrate W and the cavity roof 60 of 1 mm and gas at a pressure of 500 Pascals will also ensure that the accommodation coefficient of the resist does not have a significant effect upon the transfer of heat from the resist to the cooling element 42. In another example, providing a separation between the substrate W and the cavity roof 60 of 2 mm and gas at a pressure of 250 Pascals will also ensure that the accommodation coefficient of the resist does not have a significant effect upon the transfer of heat from the resist to the cooling element 42.

Figure 6:
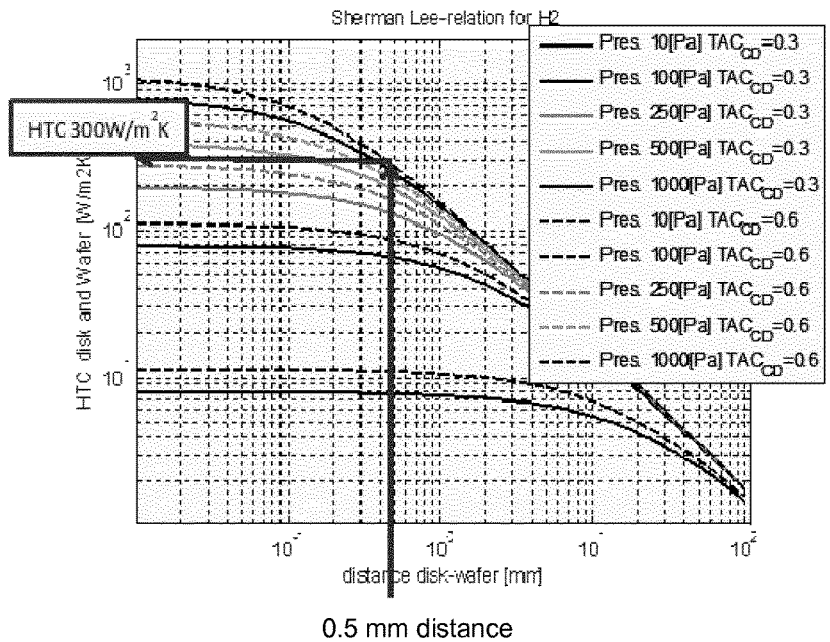
FIG. 6 is a graph which illustrates the effect of an accommodation coefficient upon embodiments of the invention.

FIG. 6 is a graph which illustrates how the coefficient of heat transfer by gas between two surfaces varies as a function of distance between those surfaces at different gas pressures. Two sets of curves are shown, a set having solid lines and a set having dashed lines. The solid lines indicate the coefficient of heat transfer when one of the surfaces has an accommodation coefficient of 0.3. The dashed lines indicate the coefficient of heat transfer when one of the surfaces has an accommodation coefficient of 0.6. The lowermost curves represent gas pressure of 10 Pascals, and the uppermost curves represent gas pressure of 1000 Pascals, with the gas pressures increasing between those two pressure values. An arrow indicates a separation between surfaces of 0.5 mm and the heat transfer coefficient (around 300 W/m²K) that will occur at a gas pressure of 1000 Pascals. As may be seen, at this separation and pressure switching between an accommodation coefficient of 0.3 (solid line) and an accommodation coefficient of 0.6 (dashed line) does not have a significant effect upon the heat transfer coefficient (e.g. changes the heat transfer coefficient by less than 10%, e.g. less than 5%). As the separation between the surfaces decreases (e.g. to 0.1 mm) the accommodation coefficient can be seen to have a significant effect upon the heat transfer coefficient. As may be seen from the graph, for a lower pressure of gas (e.g. 500 Pascals) a larger separation (e.g. 1 mm) may similarly provide a heat transfer coefficient which is not significantly affected by the accommodation coefficient.

In an embodiment in which hydrogen gas is provided at a pressure of around 1,000 Pascals and the separation between the resist surface and the cavity roof 60 is around 0.5 mm, the heat transfer accommodation coefficient between the resist surface and cavity roof 60 is around 300 W/m²K.

The amount of heat which is transferred from the substrate W to the cooling element 44 depends upon the accommodation coefficient and also upon the difference in temperature between the substrate and the cooling element. The substrate W and substrate table WT may generally have a temperature of around 22° C. The cooling element 44 may be held at a temperature which is for example between around 20° C. and 40° C. below the temperature of the substrate W and substrate table WT. For example, the cooling element 44 may for example be held at a temperature of between −18° C. and 2° C. This provides cooling of around 6000-12000 W/m²K. The cooled area provided by the cooling element 44 may measure 26 mm by 10 mm in an embodiment. In such a case the second cooling element 44 will remove around 1.5-3 W from the substrate. The first and second cooling elements together will remove around 3-6 W from a substrate.

The Peltier cooler 55 transfers heat from the bottom of the cooling element body 47 to the liquid cooling system. The liquid cooling system 57 carries the heat away from the cooling element to a remote heat transfer system.

Figure 5:
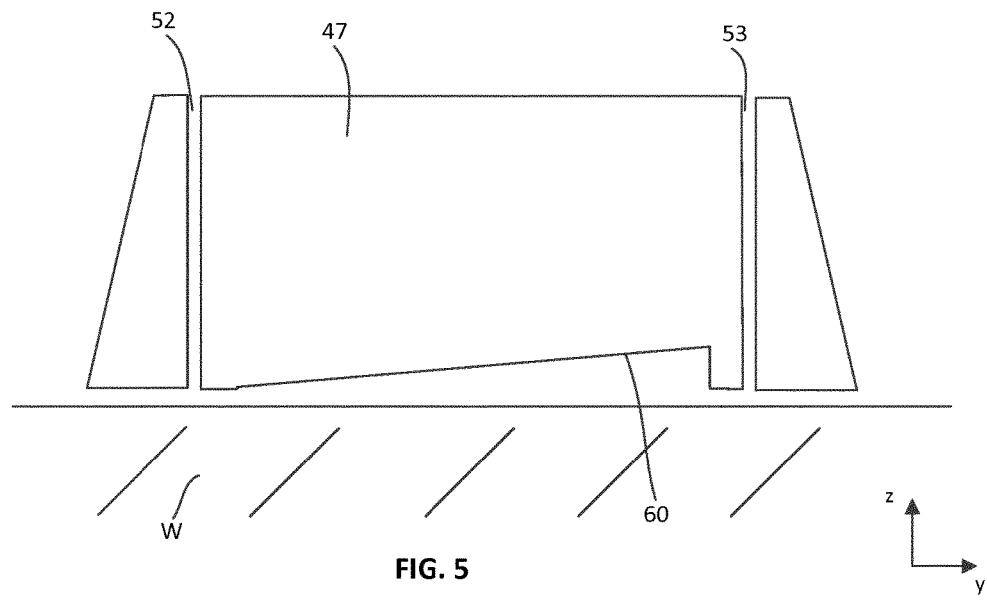
FIG. 5 schematically depicts an alternative embodiment of the cooling apparatus.

Although the cavity 48, 49 is illustrated as having a roof which lies in the XY plane, in an embodiment the roof may be tilted about the X-direction. An example of such an embodiment is shown in FIG. 5. Details of the embodiment which correspond with the embodiment of FIG. 4 (e.g. the Peltier cooler) are omitted for simplicity. In the FIG. 5 embodiment the cavity roof 60 has a height of around 0.5 mm at one end and slopes down to a zero height (or a close to zero height) at the opposite end. In an embodiment with a sloping cavity roof 60 the accommodation coefficient will become more significant as the roof height decreases. The accommodation coefficient will thus have a significant effect upon the heat transfer provided by the embodiment depicted in FIG. 5. Although the disadvantage explained above will arise, an advantage of the sloping cavity roof 60 is that the reduced gap between the roof and the substrate surface allows more efficient transfer of heat to take place. A cavity with a slopping roof may for example by used if anticipated variations of the accommodation coefficient between substrates W is sufficiently small that cooling can be controlled sufficiently accurately. Conversely, if significant variation of the accommodation coefficient of different substrates W is expected then the embodiment shown in FIG. 4 in which the cavity roof 60 is not sloping may be preferred.

Contamination molecules will leave the surface of the resist on the substrate W regularly and are a significant source of potential contamination of optics in the projection system PS (see FIG. 1). In order to prevent or reduce entry of contamination into the projection system PS a flow of gas may be provided from the projection system towards the substrate W. The cooling elements 42, 44 may be configured such that they do not generate a jet of gas which is likely to push contaminates up into the projection system. In other words, the cooling elements 42, 44 may be configured such that they do not generate a jet of gas travelling upwards in the Z-direction which is sufficiently strong to overcome the flow of gas travelling downwards in the Z-direction and out of the projection system PS. The narrow gap between the lowermost surface of the cooling elements 42, 44 and the substrate W (e.g. between 20 microns and 200 microns) may prevent a jet of gas been generated which could carry contamination into the projection system PS.

It may be desirable to maintain a gap between the cooling elements 42, 44 and the substrate, and in particular to prevent contact occurring between the cooling elements and the substrate. In an embodiment, outward flow of gas from underneath the cooling element bodies 46, 47 may provide a cushion which prevents or inhibits contact occurring between the cooling elements and the substrate. This cushion of gas may be referred to as a gas bearing foot.

In an alternative arrangement the cooling elements 42, 44 may be mounted to the projection system PS of the lithographic apparatus LA. The cooling elements may be held by a support which includes a mechanism that moves the cooling elements to a desired height above the substrate table WT. The support may be include a retraction mechanism which is configured to pull the cooling elements away from the substrate if unexpected movements are detected. This mechanism may form part of a more general safety mechanism which is triggered if unexpected movements occur within the lithographic apparatus (e.g. in the event of an earth tremor). The retraction mechanism may also be used to lift the cooling elements before they pass over sensors provided in the substrate table WT.

The surface of the substrate (in practice the surface of the resist provided on the substrate) is such that variations in height are less than 1 micron. The gap between the cooling elements 42, 44 and the substrate may be 20 microns or more, e.g. 50 microns or more. As a result, a mechanism which moves the cooling elements 42, 44 up and down to accommodate for the topology of the substrate W is not required.

During scanning exposure of a substrate a significant period of time elapses between exposure of a given target portion (e.g. a die) on the substrate W and exposure of the next target portion (e.g. a die). During this time the radiation beam B is not incident upon the substrate W and heating of the substrate by the radiation beam therefore does not take place. Although heating is not taking place during this time the Peltier cooler 55 and fluid cooling system 57 continue to operate. Attempting to switch off the Peltier cooler 55 between exposures is not desirable because the speed of response of the Peltier cooler 55 may not be sufficiently fast. Furthermore, switching the Peltier cooler on and off is liable to reduce the life time of the Peltier cooler. A valve may be used to switch off the supply of gas to the cavities 48, 49 when moving between target portions and switch the supply of gas on when a target portion is to be exposed. The valve may operate with a time constant of less than around 5 ms.

Although the cooling elements 42, 44 each comprise a Peltier cooler 55 and a fluid cooling system 57, any suitable heat removal system may be used to remove heat from the cooling elements. For example, a fluid cooling system which uses fluid at a lower temperature may be used without a Peltier cooler. For example, instead of water a fluid such as glycol which remains liquid below 0° C. may be used.

Figure 7:
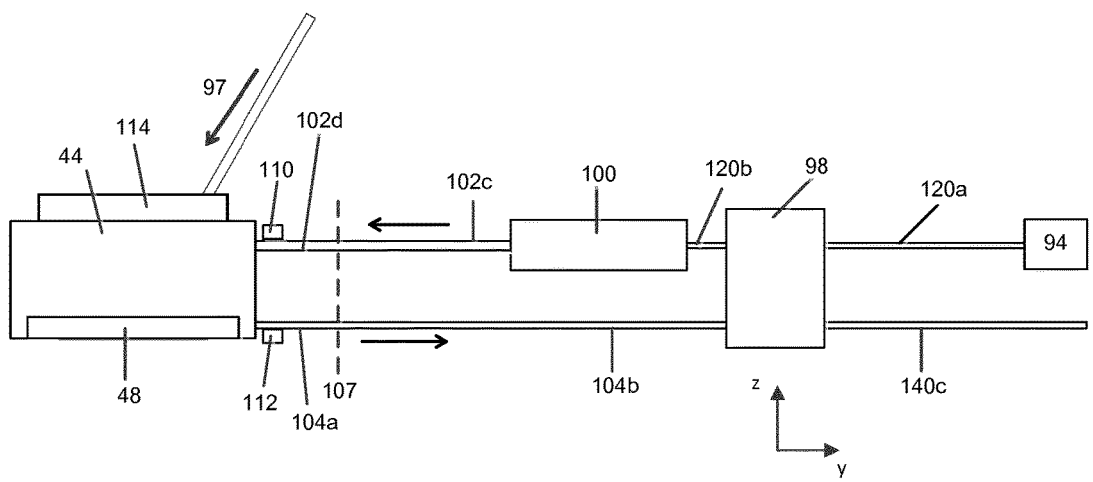
FIG. 7 schematically depicts an embodiment of the invention provided with alternative heat removal system.

An alternative heat removal system is schematically depicted in FIG. 7. In FIG. 7 a cooling element 44 with a cavity 48 is shown. Gas is delivered to the cavity by a gas delivery conduit 97. The pressure of gas in the cavity 48 may be controlled by controlling the pressure of gas delivered via the gas delivery conduit 97 (as is also the case for other embodiments). The cooling element 44 may for example have the same configuration as cooling elements described above, except that it does not comprise a Peltier cooler and fluid cooling system. Instead, heat removal from the cooling element 44 is performed by pumping nitrogen gas (or some other suitable gas) into and out of the cooling element. The gas may be cold when it is delivered to the cooling element 44 (i.e. colder than the cooling element) and therefore receives heat from the cooling element.

The gas is delivered from a gas source 94 via a first inlet conduit portion 102a to a heat exchanger 98. The gas is pre-cooled by the heat exchanger 98 and then passes via a second inlet conduit portion 102b to a Peltier cooler 100. The gas is cooled by the Peltier cooler 100 and then travels via a third inlet conduit portion 102c and a fourth inlet conduit portion 102d to the cooling element 44.

The gas receives heat from the cooling element 44 and then the heated gas passes out of the cooling element and along a first outlet conduit portion 104a. The heated gas travels through a second outlet conduit portion 104b to the heat exchanger 98. The gas then travels from the heat exchanger along a third outlet conduit portion 104c to an external location. In this way heat is removed from the cooling element 44 and is carried away from the cooling element.

The gas may for example be provided by the gas source 94 at a rate of more than 10 l/min the gas may for example be provided at a rate of 20 l/min or more (e.g. up to 50 l/min). The gas may be cooled to a temperature of for example −30° C. by the Peltier cooler 100 before it enters the cooling element 44. The gas is heated by a few degrees in the cooling element 44 (e.g. heated by less than 5° C.), and may for example have a temperature of −26° C. when it leaves the cooling element. This increase in temperature of the gas corresponds with removal of heat from the cooling element 44. The gas travels along the outlet conduit 104 to the heat exchanger where it exchanges heat with gas from the gas source 94. The gas from the gas source 94 may have a temperature which is considerably higher than −26° C. and thus is cooled by the outlet gas. The outlet gas is correspondingly warmed by the gas from the gas source 94.

The high flow of gas (i.e. more than 10 l/min) advantageously limits the thermal gradient in the cooling element 44. The thermal gradient in the cooling element may for example be limited to less than 1° C.

The Peltier cooler 100 and heat exchanger 98 are located remotely and are not located beneath the projection system PS of the lithographic apparatus LA (see FIG. 1). The Peltier cooler 100 and heat exchanger 98 may have fixed positions within the lithographic apparatus LA. The Peltier cooler 100 may be located within a vacuum area of the lithographic apparatus or may be located within a non-vacuum area of the lithographic apparatus. Similarly, the heat exchanger 98 may be located in a vacuum area of the lithographic apparatus or may be located in a non-vacuum area of the lithographic apparatus.

The Peltier cooler may for example be located 0.5 m or more away from the cooling element 44. An advantage of providing the Peltier cooler 100 away from the cooling element 44 is that more space is available to accommodate the Peltier cooler (the space beneath the projection system PS within which the cooling element 44 can be accommodated is very limited). Thus, a larger Peltier cooler 100 may be used. The Peltier cooler 100 may for example be a two-stage or three-stage (or more) Peltier cooler. This allows a larger reduction of temperature to be achieved than is possible using a smaller Peltier cooler located in the cooling element 44 (e.g. as depicted in FIG. 4).

The cooling element 44 may be moveable in the z-direction (as explained elsewhere in this document). The Peltier cooler 100 and heat exchanger 98 may be fixed (i.e. not moveable). The fourth inlet conduit portion 102d is flexible in order to allow movement of the cooling element 44 relative to the Peltier cooler 100. A dashed line 107 schematically depicts a point at which a non-flexible portion 102c of the inlet conduit connects to a flexible portion 102d of the inlet conduit. For the same reason, the first outlet conduit portion 104a is also flexible. The dashed line 107 schematically depicts a point at which the flexible portion 104a of the outlet conduit connects to a non-flexible portion 104b of the outlet conduit.

A temperature sensor 110 is provided on the inlet conduit 120d, for example in the vicinity of the cooling element 44. A temperature sensor 112 is provided on the outlet conduit 104, for example in the vicinity of the cooling element 44. These temperature sensors 110, 112 may be used to monitor the temperature of the gas entering the cooling element 44 and leaving the cooling element. This in turn allows a calculation of the amount of heat being removed from the substrate W by the cooling element 44, and thus may provide an indication of the temperature of the substrate. Feedback and/or feedforward correction may be used to adjust the temperature of the gas delivered to the cooling element 44 and/or to adjust the flow rate of the gas in order to adjust the amount of cooling applied to the substrate W.

Although the illustrated embodiment uses a Peltier cooler 100 any suitable cooler may be used. For example, a Joule Thompson cooler may be used or liquid nitrogen cooling may be used.

Because a remotely located cooler 100 (e.g. Peltier cooler) is used this allows the gas delivered by the inlet conduit 102 to be cooled to a lower temperature than would be possible if the Peltier cooler was located in the cooling element 44. This in turn allows a bigger difference to be achieved between the temperature of the cooling element 44 and the temperature of the substrate WT. This in turn provides more design freedom for the cooling element 44, for example allowing the cooling element to have a smaller footprint. Providing the cooling element with a smaller footprint allows a higher pressure of gas in the cavity 48 to be used without increasing the force applied to the substrate by the gas in the cavity 48. This in turn allows operation in the normal-pressure regime or close to the normal-pressure regime (pressure regimes are described above in connection with FIG. 6). This makes the cooling provided by the cooling element 44 less dependent upon the accommodation coefficient of the resist on the substrate W, leading to the cooling element provide a more consistent performance for substrates with different resists.

Additional advantages of the embodiment depicted in FIG. 7 over the embodiment of FIG. 4 are that no water is provided to a component above the substrate, thereby avoiding the possibility of water leaking onto the substrate and also avoiding vibrations which may be caused by pumping water.

A further advantage is that the substantial amount of heat dissipation needed due to the presence of the hot side of the Peltier in the embodiment of FIG. 4 is avoided. The cold load to the environment of the embodiment depicted in FIG. 7 may be very limited (e.g. less than 50 mW). This also makes it possible to easily measure the heat being removed from the substrate by measuring the temperature of the gas delivered to the cooling element 44, the temperature of the gas on leaving the cooling element, and measuring the flow of the gas.

In addition, less components are required in the cooling element 44, thereby simplifying the design of the cooling element and reducing the number of elements which may fail during operation of the lithographic apparatus LA.

In the embodiment of FIG. 7, or other embodiments of the invention, the cooling element 44 may include a heater 114 which may be used to effectively nullify the cooling provided by the cooling element 44 for a desired period of time. The heater 114 may be used for example when it is not desired to provide cooling using the cooling element 44 (e.g. if the cooling element is passing over a sensor of the lithographic apparatus). Using a heater to nullify the effect of the cooling element 44, instead of interrupting operation of the cooling element, avoids problems which may be caused by interrupting operation of the cooling element 44. For example, stopping flow of the gas to and from the cooling element 44 in the embodiment depicted in FIG. 7 will change the temperature of the gas in the inlet conduit 102 and the outlet conduit 104. A consequence of these changes of the gas temperature is that when the cooling element 44 resumes operation it will cool the substrate to a different temperature than was previously the case, until the temperature of the gas has stabilised.

A further alternative embodiment of the cooling system for the cooling element 44 has a configuration which corresponds with that depicted in FIG. 7 but uses a significantly smaller flow of gas from the gas source 94. For example the flow of gas may be less than 5 l/min, and may be around 2 l/min or less. Because the gas is supplied to the cooling element 44 and removed from the cooling element 44 at a slower rate, the temperature of the gas when it leaves the cooling element is higher (compared with the temperature of the gas when the gas is supplied at a higher flow rate in the manner described above). For example, instead of experiencing a temperature increase of around 4° C. the gas may experience a temperature increase of around 50° C. The temperature of the gas on entering the cooling element 44 may be around −30° C. and the temperature on leaving the cooling element may for example be around 22° C. The temperature of the gas on leaving the cooling element may correspond with the desired temperature of the substrate which is being cooled. Providing a smaller flow of gas to the cooling element 44 in this manner is advantageous because it supplies a cold load which is equal to the amount of heat that is needed to be removed from the substrate.

Figure 8:
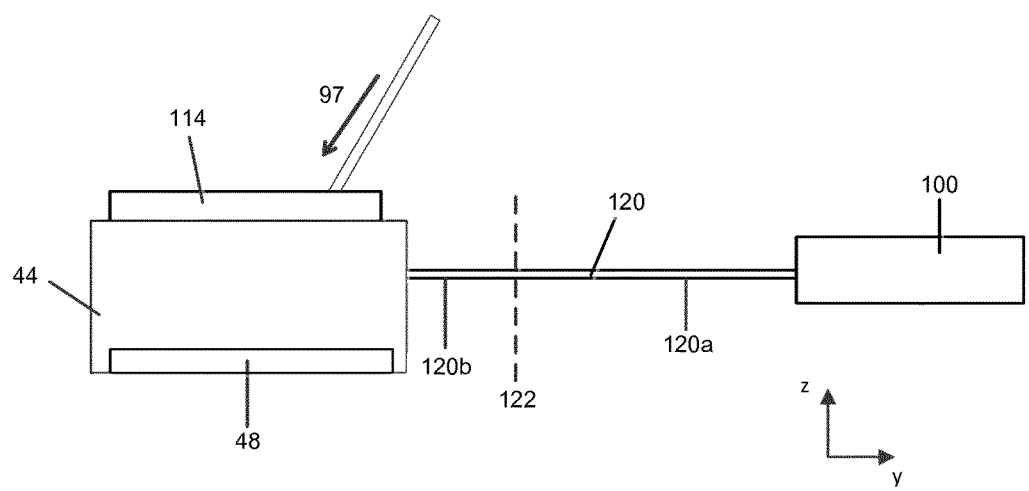
FIG. 8 schematically depicts an embodiment of the invention provided with a further alternative heat removal system.

A further alternative cooling system is schematically depicted in FIG. 8. In common with the embodiment depicted in FIG. 7, the cooling element 44 includes a cavity 48 and a gas delivery conduit 97 configured to deliver gas to the cavity. In this cooling system a heat pipe 120 is connected to the cooling element 44 at one end and is connected to a Peltier cooler 100 or other cooler at the opposite end. The heat pipe may comprise a rigid portion 120a and a flexible portion 120b. The location at which the flexible portion 120b is connected to the rigid portion 120a is schematically indicated by a dashed line 122. The flexible portion 120b of the heat pipe allows for some movement of the cooling element 44 relative to the Peltier cooler 100.

The heat pipe may for example have a cross-sectional shape which is larger in a horizontal direction (e.g. in the x-y plane) than in the vertical direction (i.e. z-direction). An advantage of the heat pipe 120 being bigger in a horizontal direction than in a vertical direction is that this allows the heat pipe to more easily be accommodated beneath the projection system PS (space between the projection system PS and the substrate W may be very limited). In an embodiment, the rigid portion 120a of the heat pipe may be larger in the vertical direction than the flexible portion 120b of the heat pipe.

The heat pipe may for example be a micro heat pipe, i.e. configured with sharp edges which act to transfer fluid via capillary action such that no wick is necessary.

In common with the embodiment described above in connection with FIG. 7 the Peltier cooler 100 is merely an example of a cooler, and any other form of cooler may be used. The cooler may be located remotely from the projection system PS of the lithographic apparatus LA (see FIG. 1), for example 0.5 meters or more away from the projection system.

Other advantages of the embodiment of FIG. 8 generally corresponds with those explained further above in connection with FIG. 7. The remotely located Peltier cooler 100 allows the cooling element 44 to be cooled to a lower temperature. This allows the cooling element to have a smaller footprint, which allows a higher pressure of gas in the cavity 48. No water is provided to a component above the substrate. The hot side of the Peltier cooler is not located in the vicinity of the substrate which is being cooled. Less components are required in the cooling element 44, thereby simplifying the design of the cooling element.

Figure 9:
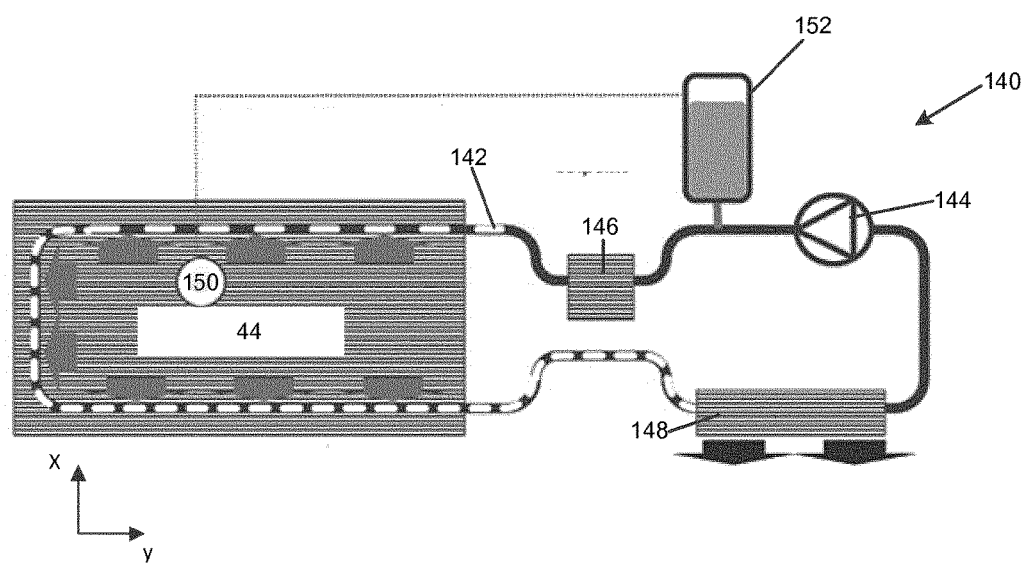
FIG. 9 schematically depicts an embodiment of the invention provided with a further alternative heat removal system.

A further alternative embodiment of the cooling system is schematically depicted in FIG. 9. This comprises a two-phase cooling system 140 in which a coolant is pumped around a coolant loop 142. The coolant removes heat from the cooling element 44 via evaporation from a liquid form to a vapour form. The two-phase cooling system comprises a pump 144, a pre-heater 146, and a condenser 148. The cooling system in addition comprises a temperature sensor 150 and an accumulator 152 which stores pressurized cooling fluid and which adjusts the pressure of the coolant delivered to the loop 142.

In operation, the coolant, which is in liquid form, is pumped by the pump 144 through the pre-heater 146. This sets the temperature of the coolant to a desired temperature. The coolant then enters the cooling element 44 and travels around the cooling element. The coolant receives heat from the cooling element 44 and evaporates to vapour form. This removes heat from the cooling element 44. The coolant fluid passes to the condenser 148 which removes heat from the coolant (e.g. using a heat exchanger which uses water or some other coolant). The coolant condenses to liquid form whilst travelling through the condenser 148. The condensed coolant, which is now in liquid form, then passes to the pump 144 from where it is once again pumped around the loop 142.

The states of the coolant in the loop 142 are schematically indicated by the form of the line of the loop. A solid line indicates that the coolant is in liquid form. A dashed line indicates that the coolant is at least partially in vapour form.

The temperature of the cooling element 44 is measured by the temperature sensor 150. The accumulator 152 is controlled to adjust the pressure of the coolant in the loop 142 in response to the temperature measured by the temperature sensor 150. Thus, if the measured temperature is too high the pressure of coolant in the loop 142 is increased in order that the coolant will remove more heat from the cooling element 44. Similarly, if the temperature measured by the temperature sensor 150 is too low then the accumulator 152 is used to reduce the pressure of the coolant in order to reduce the amount of heat which is removed from the cooling element 44 by the coolant.

Any suitable coolant that will provide two-phase cooling may be used. For example, the coolant may be $CO_2$, R134a or R1234ze.

An advantage of the embodiment depicted in FIG. 9 is that it does not require an additional heater in order to apply rapid adjustments to the amount of cooling provided to the cooling element 44 (the adjustment is obtained via the accumulator 152).

Other advantages of the embodiment of FIG. 9 generally correspond with those described further above in connection with the embodiments of FIGS. 7 and 8. The two-phase cooling system 140 allows the cooling element 44 to be cooled to a lower temperature. This allows the cooling element to have a smaller footprint, which allows a higher pressure of gas in the cavity 48. Having a hot side of a Peltier cooler in the vicinity of the substrate is avoided. Less components are required in the cooling element 44, thereby simplifying the design of the cooling element.

Figure 10:
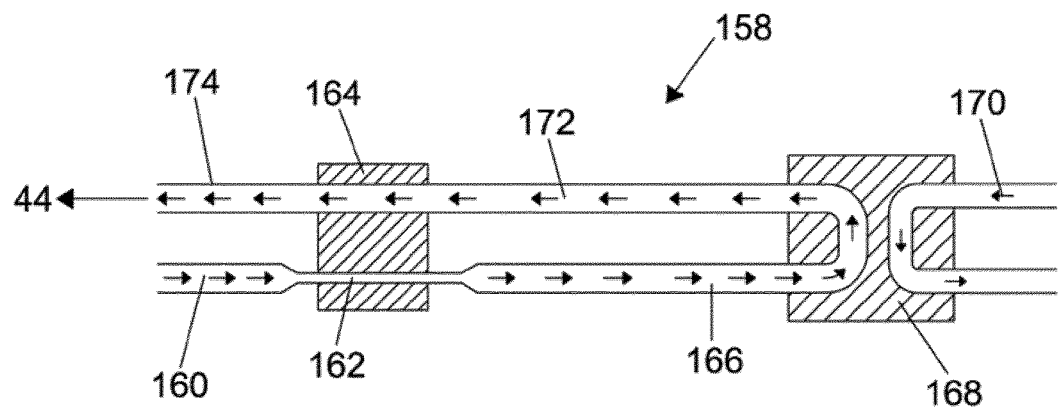
FIG. 10 schematically depicts a further alternative heat removal system which may form part of an embodiment of the invention.

FIG. 10 schematically depicts a cooler 158 which may be used to deliver cooled gas to the cooling element 44 instead of the Peltier cooler 100 depicted in FIGS. 7 and 8. The cooler 158 includes a constriction 162 which increases the rate of flow of the gas. The constriction expands the gas, as a result of which the mass flow of the gas stays the same but the volume flow increases, thereby lowering the temperature of the gas.

Gas traveling through an inlet conduit 160 of the cooler 158 may be at around room temperature (e.g. 22° C.). The gas passes through a constriction 162 which acts to increase the rate of flow of gas and thereby lower the temperature of the gas. Because the gas velocity inside the constriction 162 is significantly higher than before the gas entered the constriction, the gas temperature is significantly lower and may for example be around 2° C. The constriction is located inside a first heat exchanger 164. Because the temperature of the gas inside the constriction 162 is low, the gas absorbs heat from the first heat exchanger 164. The temperature of the heat exchanger may for example be around 12° C.

Upon leaving the constriction 162, the gas enters a second gas conduit 166 which has a larger diameter than the constriction (e.g. the same diameter as the first gas conduit 160). The gas thus decelerates to a lower gas velocity. Because the gas has received heat from the heat exchanger 164 the gas now has a higher temperature than its initial temperature. The gas may for example have a temperature of around 32° C.

The gas travels along the second gas conduit 166 to a second heat exchanger 168 where heat is removed from the gas and transferred to water (or some other fluid delivered by a conduit 170). This may cool the gas to for example a temperature of around 22° C. The gas then travels along a third gas conduit 172 and back through the heat exchanger 164. This cools the gas by a significant amount, for example several ° C. The cooled gas, which may for example have a temperature of around 12° C., is then delivered via a fourth gas conduit 174. The fourth gas conduit 174 may be connected to the cooling element 44.

In an alternative configuration the first heat exchanger 164 may be the cooling element.

The diameter of the constriction 162 may be tuned to provide high flow velocities. A temperature drop of around 9° C. may be achievable when the velocity is the speed of sound. A flat tube with length 10 cm and cross-section 5×0.5 mm, and an upstream pressure of 180 mbar and a downstream pressure of 20 mbar will achieve about 1000 m/s gas velocity in the last centimeter and roughly 300 m/s in the first nine centimeters, at a hydrogen flow rate of 100 mbar l/s.

Advantages of the embodiment depicted in FIG. 10 generally correspond with advantages described above in connection with FIGS. 7-9. The embodiment allows the cooling element 44 to be cooled to a lower temperature. This allows the cooling element to have a smaller footprint, which allows a higher pressure of gas in the cavity 48. Having a hot side of a Peltier cooler in the vicinity of the substrate is avoided. Less components are required in the cooling element 44, thereby simplifying the design of the cooling element.

A cooling element 202 according to an embodiment of the invention is schematically depicted in cross-section in FIG. 11. The cooling element 202 may form part of a cooling apparatus 40 of the lithographic apparatus (see FIG. 1). As indicated by the Cartesian coordinates in FIG. 11, the cross-section is along the X-direction (in contrast to preceding figures which have shown a cross-section in the Y-direction). The cooling element 202 may include features which have been described above in connection with other embodiments. For brevity these are not included in the description of this embodiment. Thus, for example, the embodiment may include a heat removal system such as a Peltier cooler and a fluid cooling system. Similarly, for example, the embodiment may include a retraction mechanism. Considerations explained further above relating to the pressure of gas and the separation between the cooling element 202 and the substrate may apply in connection with this embodiment (and in connection with other embodiments).

The cooling element 202 comprises a body 204 connected to a gas delivery conduit 206 which receives gas via a valve 208. A chamber 210 within the body 204 receives gas from the gas delivery conduit 206. The body 204 has a floor 212 which forms a lowermost surface of the chamber 210. The floor 212 is provided with holes 214 through which gas can flow from the chamber 210. The cooling element 202 is located above a substrate W, and the gas which passes out of the holes 214 fills a space between the cooling element 202 and the substrate W until it flows out from beneath the cooling element (as schematically depicted by arrows). The gas has a lower temperature than the substrate W. The gas facilitates transfer of heat from the substrate W to the cooling element 202 (which has a lower temperature than the substrate). The gas thus acts to cool the substrate. The gas, which may be referred to as cooling gas, may for example be Hydrogen (or an inert gas). Appropriate temperatures which may be used for the cooling gas (and the cooling element 202) are discussed elsewhere in this document in connection with other embodiments.

Figure 11A:
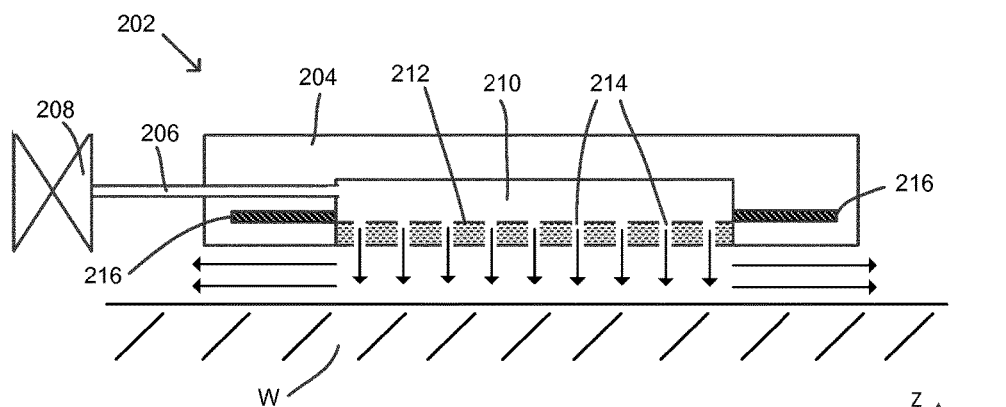
FIGS. 11A-11B schematically depict in cross section a cooling element according to an embodiment of the invention.

The holes 214 may be distributed across the floor 212. The holes 214 may for example measure at least 10 microns across. The holes 214 may for example measure up to 50 microns across. The holes 214 may be provided as a two-dimensional array. A separation of at least 100 microns may be provided between adjacent holes 214. A separation of up to 1 mm may be provided between adjacent holes 214. The separation between adjacent holes in the X-direction may be different from the separation between adjacent holes in the Y-direction. The holes 214 may for example be formed using laser drilling. Although nine holes are depicted in FIG. 11A (and 45 holes in FIG. 11B) this is merely a schematic illustration, and any suitable number of holes may be used.

Figure 11B:
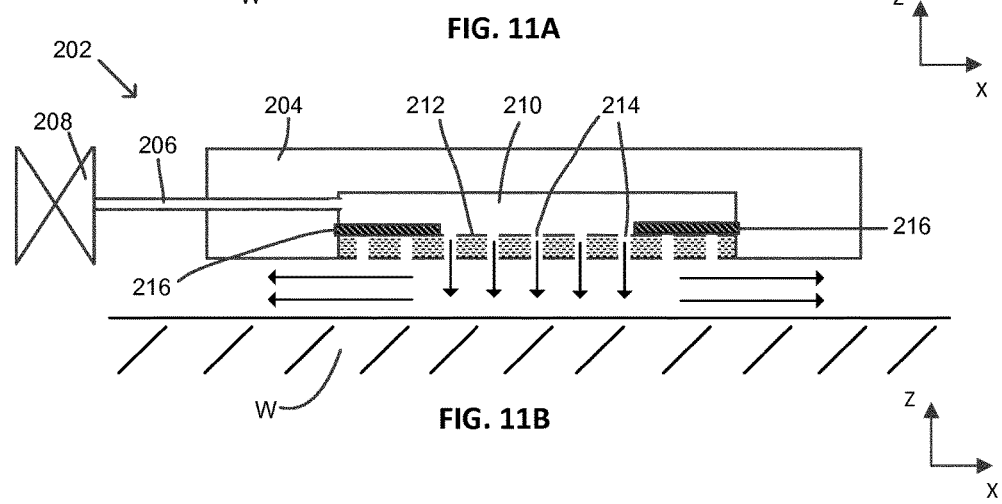

The cooling element 202 further comprises shutters 216. The shutters 216 are movable in the X-direction (the non-scanning direction) and act to close some of the holes 214 in the floor 212 of the chamber 210. In FIG. 11A the shutters 216 are in a first position in which they do not close holes 214 in the floor 212. This position may be referred to as the retracted position. In FIG. 11B the shutters 216 have been moved to a position in which they close some of the holes 214 in the floor 212 of the chamber 210. This position may be referred to as the deployed position. As may be seen from comparing FIG. 11A with FIG. 11B, the X-direction dimension of the substrate area onto which cooling gas is incident is reduced when the shutters 216 are moved from the retracted position to the deployed position. This is advantageous for the reasons discussed below in connection with FIG. 12.

Figure 12:
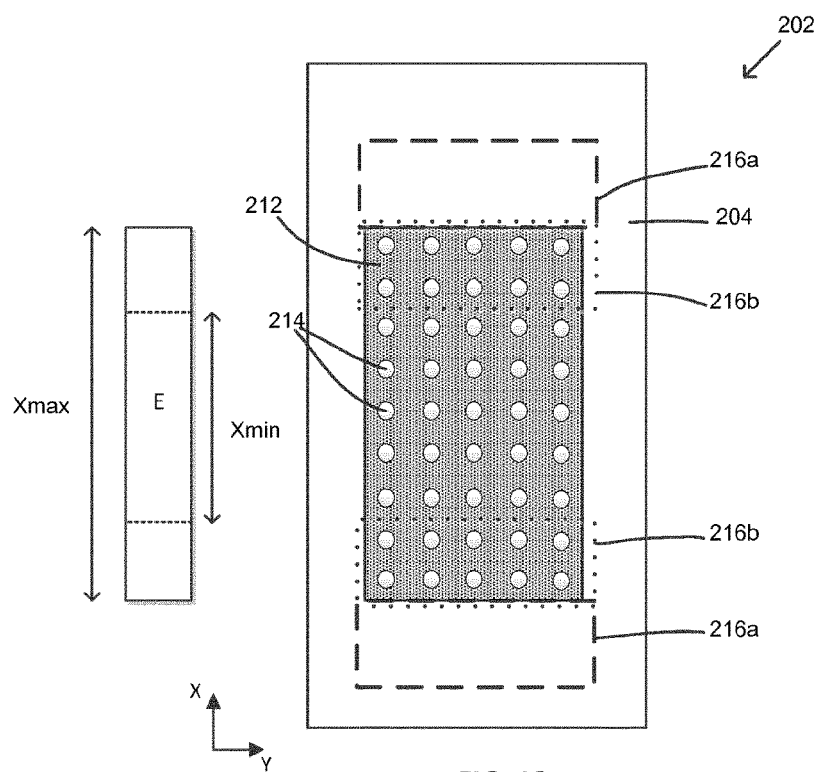
FIG. 12 schematically depicts viewed from below the embodiment of FIG. 11.

FIG. 12 schematically depicts the cooling element 202 viewed from below. Also depicted in FIG. 12 is the exposure area E which is illuminated by the radiation beam B of the lithographic apparatus LA (see FIG. 1). The body 204 of the cooling element 202 forms an outer perimeter which surrounds the floor 212 of the cooling element. The floor 212 is provided with holes 214 out of which gas flows during operation of the cooling element 202. The shutters 216 of the cooling element 202 will not be visible when the cooling element is viewed from below, but are depicted here in order to facilitate understanding of the invention. The shutters are movable from the retracted position 216a (depicted with dashed lines) to the deployed position 216b (depicted with dotted lines).

During operation of the lithographic apparatus LA (see FIG. 1) the size of the exposure area E which is illuminated by the radiation beam B in the X-direction (the non-scanning direction) may be selected by an operator of the lithographic apparatus. This selection may be determined by the size of dies which are to be exposed on substrates W by the lithographic apparatus. The maximum X-direction dimension of the exposure area E may for example be 26 mm (although other maximum X-direction dimensions are possible). The maximum X-direction dimension is labelled $X_{max}$ in FIG. 12. The minimum X-direction dimension of the exposure area E may for example be 16.5 mm (although other minimum sizes are possible). The minimum size of the exposure area is labelled $X_{min}$ in FIG. 12. The X-direction dimension of the exposure area E may adjusted by the illuminator IL of the lithographic apparatus LA (see FIG. 1), for example using masking blades (not depicted) in a known manner.

The shutters 216 of the cooling element 202 allow the X-direction dimension of the area which onto which cooling gas is directed to be adjusted, so that it corresponds with the X-direction dimension of the exposure area E. Thus, when the exposure area E has the maximum size $X_{max}$ the shutters 216 are in the retracted position 216a. The X-direction dimension of holes in the floor 212 which deliver gas to the substrate then substantially corresponds with $X_{max}$. When the exposure area E has the minimum X-direction size $X_{min}$, the shutters 216 are in the deployed position 216b. The X-direction dimension of holes in the floor which deliver gas onto the substrate then substantially corresponds with $X_{min}$.

Other X-direction dimensions of the exposure area E are possible between $X_{max}$ and $X_{min}$. The shutters 216 may be deployed to intermediate positions between the retracted position and the deployed position accordingly. Thus, the shutters 216 are positionable such that the cooling element 202 directs cooling gas onto an area which has an X-direction dimension that corresponds with the X-direction dimension of the exposure area E. By matching the X-direction dimension of the area to which cooling gas is delivered with the X-direction dimension of the exposure area E, the embodiment avoids directing cooling gas onto an area which extends beyond X-direction edges of the exposure area. If cooling gas were to be delivered onto an area which extends beyond X-direction edges of the exposure area E then this could cause unwanted distortion of the substrate. This could in turn reduce the accuracy with which the lithographic apparatus is able to project a pattern onto the substrate. For example, the cooling gas could cause cooling of part of a die adjacent to the die currently being exposed and thereby reduce overlay accuracy when a pattern is subsequently projected onto that adjacent die. This issue is avoided by the embodiment of the invention because the X-direction dimension of the area onto which cooling gas is incident corresponds with the X-direction dimension of the exposure area E.

In the illustrated embodiment of the invention when the shutters 216 are in the retracted position 216a they do not close any of the holes 214 in the floor 212 of the cooling element 202. However, it is not necessary that this is the case. Thus, for example, the shutters 216 may close some holes 214 of the floor 212 when they are in the retracted position. Whether or not this is the case will depend upon the specific configuration of the shutters and the floor. In any event, moving the shutters from the retracted position 216a to the deployed position 216b closes some holes 214 in the floor 212 of the cooling element 202.

In an alternative arrangement, instead of providing holes in the floor 212 the floor may be formed from a porous material. Where this is the case, a network of pores in the material allow the gas to flow out of the floor 212. Examples of porous materials which may be used are graphite (e.g as sold by Xycarb Ceramics of Helmond, Netherlands) and sintered ceramics (e.g. as sold by Gimex of Geldermalsen, Netherlands). The porosity of the porous material may be reduced if desired by applying an epoxy layer together with a solvent to a surface of the porous material. The amount of solvent used may be selected such that a desired permeability of the layer is achieved.

The holes 214 and the pores of the porous material may both be considered to be examples of openings which allow gas to pass through the floor 212. The shutters 216 work in the same way irrespective of whether the openings are holes 214 or pores of a porous material. Thus, moving the shutters 216 from the retracted position 216a to the deployed position 216b closes some openings in the floor 212 of the cooling element 202.

Although only a single cooling element 202 is depicted in FIGS. 11 and 12, it will be appreciated that cooling elements according to this embodiment may be provided on either side of the exposure area E of the lithographic apparatus (e.g. in an arrangement which corresponds with the arrangement depicted in FIG. 3).

Although the illustrated embodiment has two shutters, some other number of shutters may be used. For example, a single shutter may be used. Where this is the case, some X-direction movement of the cooling element 202 may be needed in combination with movement of the shutter. This will ensure that openings that have not been closed by the shutter remain aligned with the exposure area E in the X-direction.

In a further embodiment (not illustrated) a cooling element may be generally as depicted in FIGS. 11 and 12 but without the shutters 216 being present. Thus, the cooling element may include a floor provided with openings through which gas is delivered onto a substrate. The openings may for example be an array of holes or pores of a porous material.

FIG. 13 schematically depicts an alternative embodiment of the invention which provides similar functionality to the embodiment depicted in FIGS. 11 and 12 but does so in a different manner. FIG. 13 is a schematic cross-sectional view of a cooling element 302 according to an embodiment of the invention. As with FIG. 11, the cross-section is along the X-direction of the cooling element. The cooling element 302 comprises a body 304 within which three chambers 306-308 are provided. The chambers are separated from each other by walls 310. The chambers may be referred to as outer chambers 306, 308 and an inner chamber 307. Each chamber is connected to a different gas conduit along with associated valves (not depicted in FIG. 13). The body 304 has a floor 312 which forms a lowermost surface of the chambers 306-308. The floor 312 is provided with holes 314 through which gas can flow from the chambers 306-308. The cooling element 302 is located above a substrate W, and the gas which passes out of the holes 314 fills a space between the cooling element 302 and the substrate W until it flows out from beneath the cooling element (as schematically depicted by arrows). The gas has a lower temperature than the substrate W and thus acts to cool the substrate. The gas may be referred to as cooling gas. Appropriate temperatures which may be used for the cooling gas are discussed elsewhere in this document in connection with other embodiments. Features and considerations discussed in connection with other embodiments may also be used in connection with this embodiment.

Figure 13A:
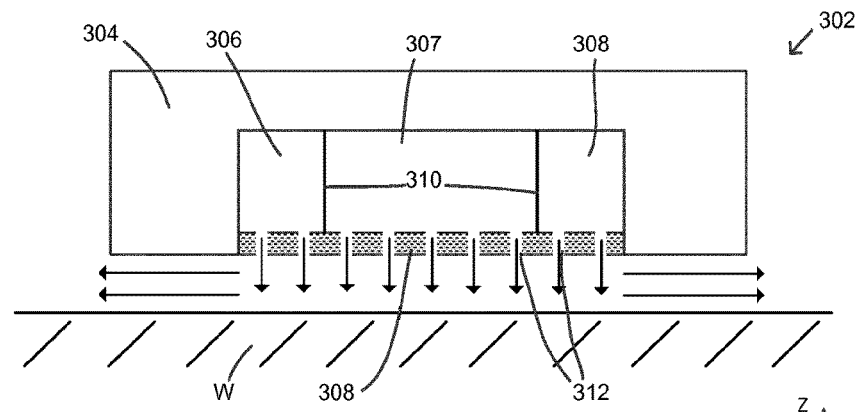
FIGS. 13A-13B schematically depict in cross section a cooling element according to an alternative embodiment of the invention.

Referring to FIG. 13A, valves connected to all of the gas conduits may be open such that gas is delivered to all of the chambers 306-308. Since gas is being delivered to all of the chambers 306-308 gas passes out of holes 314 distributed across the full X-direction dimension of the floor 312. This may correspond with the maximum X-direction dimension $X_{max}$ of the exposure area E of the lithographic apparatus (see the left hand side of FIG. 12)

Figure 13B:
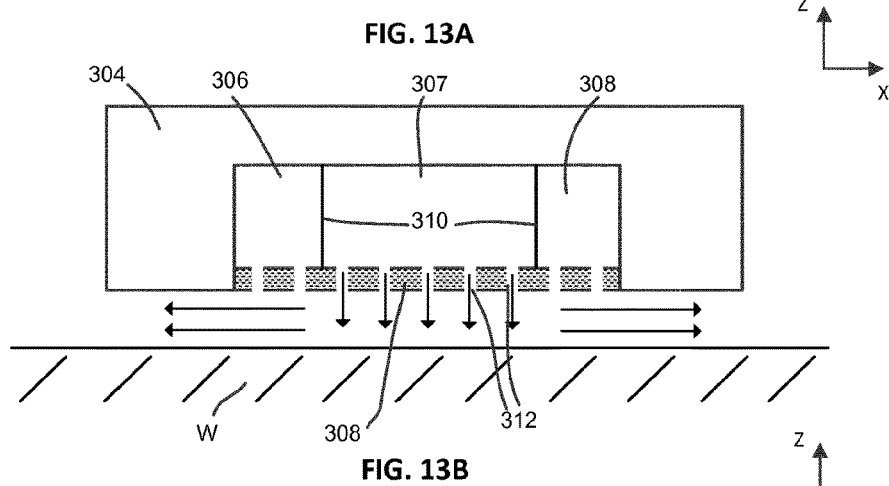

Referring to FIG. 13B, valves connected gas conduits which pass to the outer chambers 306, 308 may be closed, with the valve connected to the gas conduit which passes to the inner chamber 307 being open. Since no gas has been delivered to the outer chambers 306, 308 there is no flow of gas through holes 314 in the floor 312 located beneath those outer chambers. Gas continues to flow from holes 314 in the floor 312 of the inner chamber 307. Thus, the X-direction dimension of substrate area onto which gas is delivered is reduced in FIG. 13B when compared with FIG. 13A. The walls 310 may be positioned such that the X-direction dimension onto which gas is delivered from the inner chamber 307 corresponds with the minimum X-direction dimension $X_{max}$ of the exposure area E of the lithographic apparatus (see the left hand side of FIG. 12).

The walls 310 may be thin (e.g. less than 1 mm thickness) in order to minimise the X-direction dimension portion which does not receive cooling gas from the floor 312 (the portion of the floor which is immediately beneath the walls 310 may be blocked by the walls from emitting cooling gas).

The cooling element 302 of FIG. 13 may incorporate features described above in connection with the cooling element of FIGS. 11 and 12. For example, the holes 314 may have properties described above in connection with FIGS. 11 and 12. The floor 312 may be formed from porous material. The holes 314 and pores of the porous material are examples of openings through which cooling gas may flow.

FIG. 14 schematically depicts in cross-section viewed from above a cooling apparatus 40 which comprises two cooling elements 302, 303 of the form illustrated in FIG. 13. FIG. 14 also schematically depicts gas conduits of the cooling apparatus and the exposure area E of the lithographic apparatus. As has been explained above in connection with FIG. 13, the cooling elements 302, 303 each comprise an inner chamber 307 a first outer chamber 306 and a second outer chamber 308. The chambers 306-308 are separated from each other by walls 310. A first valve 316 is connected to a first gas conduit 318 which branches into two parts 318a, 318b. The gas conduit branches 318a, 318b are respectively connected to a first outer chamber 306 of the first cooling element 302 and to a second outer chamber 306 of the second cooling element 303. A second valve 320 is connected to a second gas conduit 322. The second gas conduit 322 splits into two branches 322a, 322b which are respectively connected to a second outer chamber 308 of the first cooling element 302 and a second outer chamber 308 of the second cooling element 303. A third valve 324 is connected to a third gas conduit 326. The third gas conduit 326 splits into two branches 326a, 326b which are respectively connected to the inner chamber 307 of the first cooling element 302 and to the inner chamber 307 of the second cooling element 303.

Figure 14A:
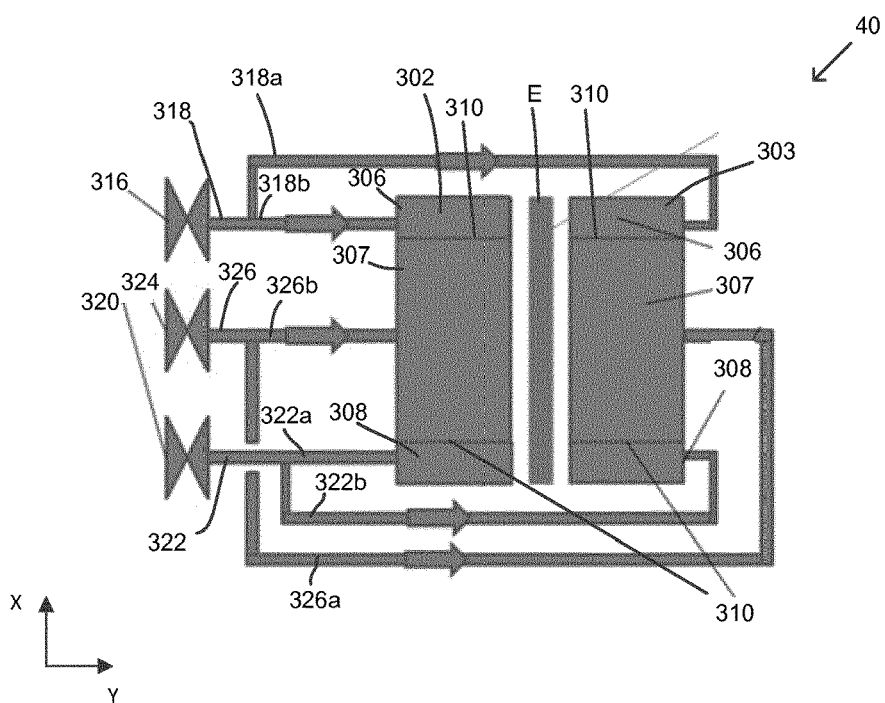
FIGS. 14A-14B schematically depict viewed from below the embodiment of FIG. 13.

As schematically depicted in FIG. 14A, when all of the valves 316, 320, 324 are open gas is delivered to all of the chambers 306-308 of the cooling elements 302, 303. As a result, the X-direction dimension of a substrate onto which gas is delivered by the cooling elements 302, 303 correspond with the maximum X-direction dimension $X_{max}$ of the exposure area E of the lithographic apparatus.

Figure 14B:
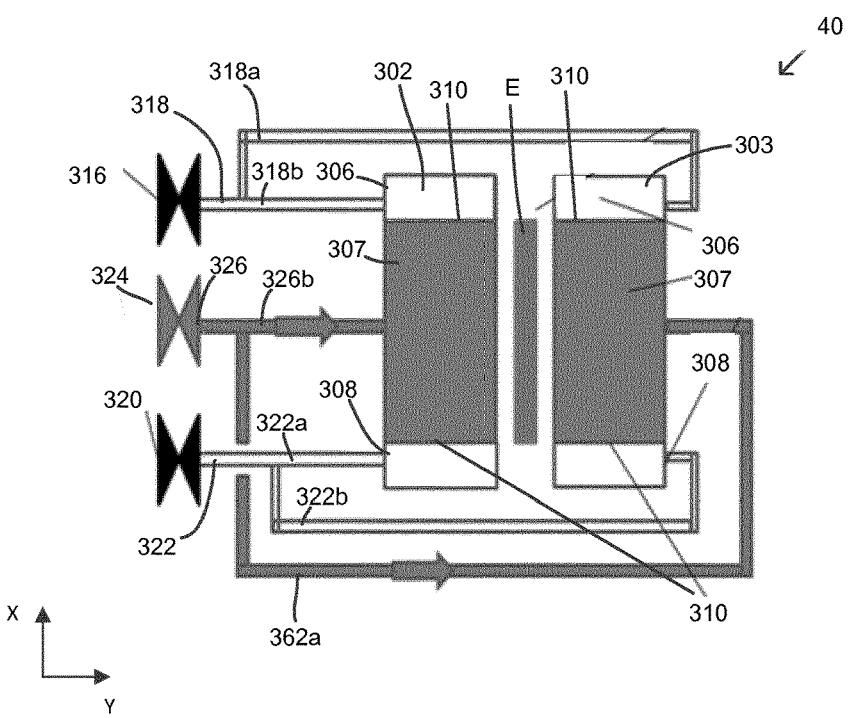

In FIG. 14B the first and third valves 316, 320 are closed and as a result no gas flows to the outer chambers 306, 308 of the cooling elements 302, 303. The third valve 324 is open and thus gas flows to the inner chamber 307 of the cooling elements 302, 304. As a result, gas does not flow out of the outer chambers, 306, 308 but does flow out of the inner chambers 307 of the cooling elements 302, 303. Thus, cooling gas is delivered across a smaller X-direction dimension of a substrate being exposed by the lithographic apparatus. The X-direction dimension to which cooling gas is delivered may correspond with the X-direction dimension of the exposure area E which is illuminated by the lithographic apparatus. This may for example be the minimum X-direction dimension $X_{min}$ of the exposure area E of that lithographic apparatus.

Thus, by opening and closing the first and third valves, 316, 320 the X-direction dimension to which cooling gas is delivered may be switched between a maximum value and a minimum valve. In an alternative configuration (not depicted) a single valve may arranged to control the flow of gas to both of the outer chambers 306, 308, for example via a single conduit which splits into four conduits.

A disadvantage of the embodiment of FIGS. 13 and 14 compared with the embodiment of FIGS. 11 and 12 is that the X-direction dimension to which cooling gas is delivered is not controllable to values which are between the minimum and maximum values. Thus, if the exposure area E used by the lithographic apparatus has an X-direction dimension which is somewhere between the minimum dimension $X_{min}$ and the maximum dimension $X_{max}$, the X-direction dimension of the substrate onto which cooling gas is delivered by the cooling elements 302, 303 will not correspond with the exposure area E.

An advantage of the embodiment of FIGS. 13 and 14 is that the moveable elements (i.e. valves 316, 320, 324) which control the delivery of gas from the cooling elements 302, 303 are located away from the cooling elements themselves. In contrast, in the embodiment of FIGS. 11 and 12, the shutters 216 are located inside the cooling element 302. As will be appreciated from FIG. 1, the cooling elements 202, 302, 303 form part of a cooling apparatus 40 which is located beneath the projection system PS of the lithographic apparatus and above the substrate table WT of the lithographic apparatus. This is a relatively inaccessible location. Thus, maintenance and repair of the valves 316, 320, 324 of the embodiment of FIGS. 13 and 14 may be significantly easier than maintenance and repair of the shutters of the embodiment of FIGS. 11 and 12.

Figure 15:
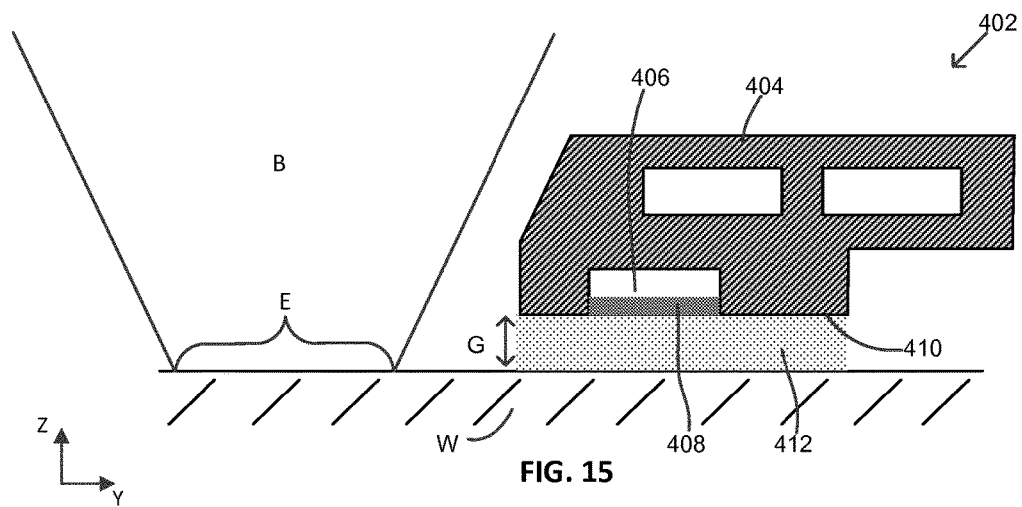
FIG. 15 schematically depicts in cross section a cooling element according to an alternative embodiment of the invention.
Figure 16:
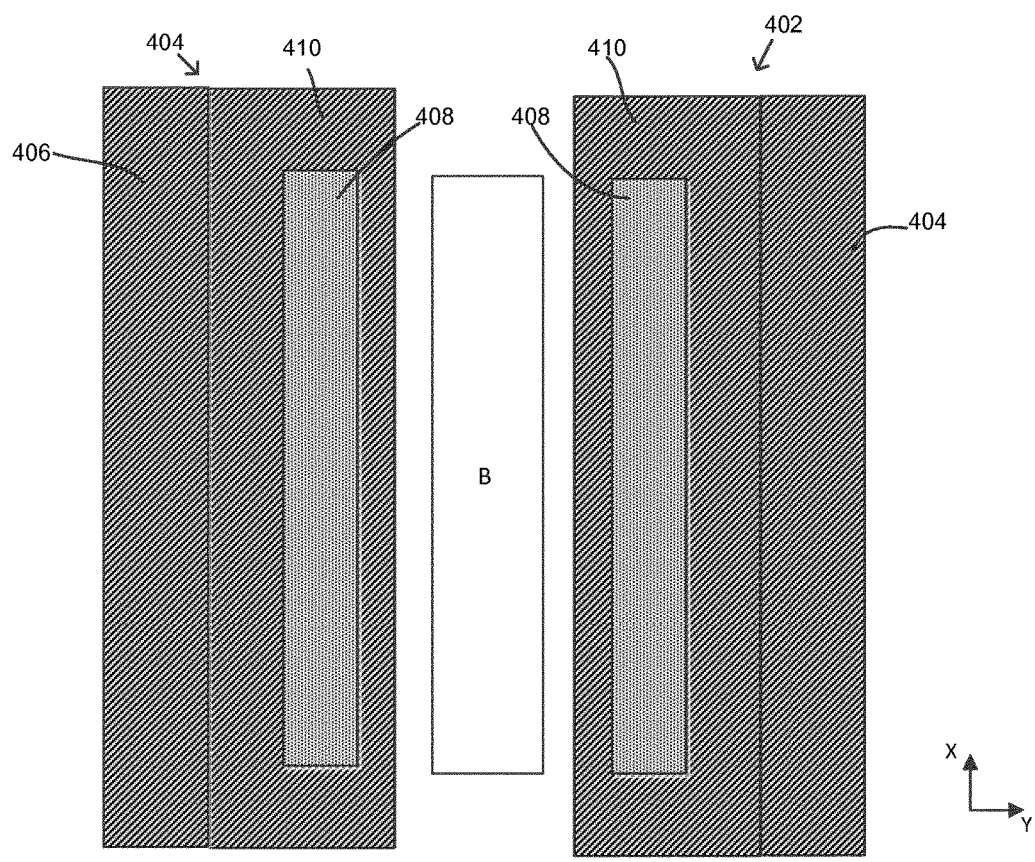
FIG. 16 schematically depicts viewed from below a cooling apparatus which comprises the cooling element of the embodiment of FIG. 15.

FIG. 15 schematically depicts a cooling element 402 according to an alternative embodiment of the invention. In common with other embodiments of the invention, the cooling element 402 is configured to direct cooling gas onto a substrate W at a location which is adjacent to an exposure area E which is illuminated by a radiation beam B during operation of a lithographic apparatus. The cooling element 402 is schematically depicted in cross-section in FIG. 15 and schematically depicted viewed from below in FIG. 16. FIG. 15 is enlarged relative to FIG. 16. In common with some other embodiments, no gas delivery conduit is depicted in FIGS. 15 and 16 although in practice the embodiment will include a gas delivery conduit. Features and considerations discussed in connection with other embodiments may also be used in connection with this embodiment.

The cooling element 402 comprises a body 404 which is provided with a chamber 406. The chamber 406 has a floor 408 formed from a porous material (examples of suitable porous material are described further above). The body 404 has a lowermost surface 410 which faces towards the substrate W. Part of the lowermost surface 410 is formed by the floor 408 of porous material. The lowermost surface 410 of the body 404, which may be substantially planar, is separated from the substrate W by a gap G which may for example be around 80 microns. The gap G may for example be less than 200 microns, and may for example be less than 100 microns. The gap G may for example be greater than 20 microns.

Cooling gas which has been delivered through the floor 408 of porous material fills the gap G between the lowermost surface 410 of the body 404 and the substrate W. The cooling gas in the gap G is schematically depicted by a shaded area 412. The cooling gas 412 may for example be hydrogen (or may be some other gas). The cooling gas 412 has a temperature which is lower than the temperature of the substrate. The cooling gas 412 facilitates transfer of heat from the substrate W to the cooling element body 404, which also has a temperature that is lower than the temperature of the substrate. The cooling gas 412 thus acts to cool the substrate W.

The cooling element 402 of FIG. 15 further comprises first and second cooling fluid channels 414, 416. Cooling fluid is pumped through the cooling fluid channels 414, 416 and thereby carries heat away from the cooling element 402. The cooling fluid may for example be nitrogen gas (or some other gas) and may be for example cooled to a temperature of around −100° C. The nitrogen gas may for example be held at a pressure which is above atmospheric pressure (e.g. greater than 4 bar, e.g. around 8 bar, e.g. 12 bar or less). The nitrogen (or other gas) acts to cool the cooling element 402 to a temperature which is below 0° C. The nitrogen (or other gas) may act to cool the cooling element 402 to a temperature which is below −50° C., and may act to cool the cooling element to a temperature which is below −70° C. (e.g. around −100° C.). Since the cooling element 402 is held at a temperature which is below 0° C., e.g. around −100° C., the cooling gas in the chamber 406 is also cooled to that temperature. Consequently, cooling gas 412 delivered through the porous floor 408 has the same temperature as the temperature of the cooling element 402.

The cooling gas is delivered at a rate which will provide a pressure of cooling gas 412 between the cooling element 402 and the substrate W which is greater than atmospheric pressure. The pressure may for example be in the excess of 500 pascals, and may for example be around 700 pascals. The pressure may for example be less than 1000 pascals. The cooling gas 412 may for example provide a heat transfer coefficient which is greater than 300 W/m²K. The cooling gas 412 may for example provide a heat transfer coefficient which is less than 600 W/m²K. The cooling gas 412 may for example provide a heat transfer coefficient of around 450 W/m²K.

The cooling element 402 is located adjacent to the edge of the exposure area E. In this context the term 'adjacent' may be interpreted as meaning less than 1 cm from the edge of the exposure area E. The cooling element 402 may be less than 0.5 cm from an edge of the exposure area E, and may be around 1 mm from an edge of the exposure area. The cooling element 402 may be within the range 1 mm-1 cm from the edge of the exposure area E. The smaller the separation between the cooling element and the exposure area, the greater the extent to which some undesirable distortions of the substrate caused by substrate heating are avoided In order for the cooling element 402 to be located as close as possible to the exposure area E, the cooling element may be shaped such that it does not intersect with the radiation beam B when it is at a desired distance from the exposure area E. Thus, for example, the cooling element in this embodiment is provided with a sloping inner surface 418 which faces towards the radiation beam B. The sloping surface 418 may for example subtend an angle relative to the vertical which substantially corresponds with the angle subtended by the radiation beam B relative to the vertical. This shape avoids the cooling element 402 having an innermost corner which projects into the radiation beam B. A corresponding shape may be used for cooling elements according to other embodiments of the invention.

The cooling element 402 is thin (when measured in the vertical direction) because this allows the cooling element to be positioned closer to the radiation beam B without intersecting with the radiation beam. Thus, for example, the cooling element may have a thickness in the vertical direction (the z-direction) which is 3 mm or less. The thickness of the cooling element 402 may for example be 2 mm or less. The cooling element 402 is sufficiently thick to allow space for the chamber 406 which receives the cooling gas and also to allow space for the cooling fluid channels 414, 416. A minimum thickness for the cooling element 402 may thus for example be around 1 mm.

The closer the cooling element 402 is to the exposure area E the greater the extent to which some undesirable distortions of the substrate caused by substrate heating are avoided. Thus, for example, a separation of less than 3 mm between the cooling element 402 and the edge of the exposure area E may be desirable. A separation of 2 mm or less may be preferred since this provides even more effective cooling. A separation of 1 mm or less may be most preferred, although this may be challenging to implement in practice. There may be for example a tolerance of around 0.3 mm of the position of the edge of the exposure area E. There may be a tolerance of for example around 0.3 mm of the accuracy with which the cooling elements 402 can be positioned relative to the exposure area E. The above mentioned values may take this into account. Thus, the above mentioned values may for example have an accuracy of +/−0.6 mm.

The lowermost surface 410 of the cooling element 402 may for example measure between 1 mm and 3 mm in the Y-direction (e.g. between 1.5 mm and 2 mm). The lowermost surface 410 of the cooling element 402 may for example measure less than 5 mm in the Y-direction. The length of the lowermost surface 410 in the Y-direction has a significant impact upon the amount of cooling which is provided to the substrate W because this determines the area of cooling gas 412 which is located between the cooling element 402 and the substrate. The floor 408 of porous material may for example be separated by around 0.5 mm from an inner edge of the cooling element 402 measured in the Y-direction (scanning direction). The floor 408 of porous material may for example have a length in the Y-direction of between 0.3 mm and 0.7 mm (e.g. around 0.5 mm).

The embodiment of FIG. 15, by providing cooling at locations close to the exposed area E, may reduce the tendency of the substrate to expand due to heating caused by the radiation beam B. Such expansion is particularly problematic at the edge of the substrate because the substrate tends to be less well restrained by the substrate table WT at its edges. An additional benefit of the embodiment is that it may relax the stiffness tolerance with which burls of the substrate table WT must be provided (the required precision of stiffness of the burls is interrelated with expansion of the substrate due to heating).

FIG. 16, depicts viewed from below a first cooling element 402 on one side of the exposure area E and a second cooling element 403 on an opposite side of the exposure area. The cooling elements are of the type illustrated in FIG. 15. One cooling element 402 cools an area of the substrate prior to that area being exposed by the radiation beam B, and the other cooling element 403 cools the substrate after the area has been exposed. This will swap over when the direction of scanning exposure swaps over.

As will be appreciated from FIG. 16, the X-direction dimension of the floor 408 formed from porous material may correspond with the X-direction of the exposure area E. This may for example be the maximum X-direction dimension $X_{max}$ of exposure area which the lithographic apparatus is capable of illuminating. The cooling elements 402, 403 may include one or more shutters or chambers or other components (not depicted) which are operable to adjust the X-direction dimension of the floor 408 through which cooling gas is delivered.

Although the embodiment depicted in FIGS. 15 and 16 has a floor 408 formed from porous material, in other embodiments the floor may be formed from a non-porous material with an array of holes being provided in the floor to allow cooling gas to be delivered through the floor. The holes may include properties mentioned further above in connection with the preceding embodiment. The holes and the pores are examples of openings through which cooling gas may flow.

Embodiments of the invention depicted in FIGS. 2-4 may be modified such that they include a floor which faces towards the substrate W instead of having cavities 48, 49. The floor may be substantially planar and may for example be coplanar with the lowermost surface of the cooling element. The floor may be provided with openings (e.g. formed from a porous material or provided with an array of holes). A chamber may be provided above the floor from which gas is delivered through the floor.

Although described embodiments of the invention comprise two cooling elements other embodiments of the invention may comprise other numbers of cooling elements. For example, a single cooling element may be provided. The single cooling element may for example extend along one side of the exposure area E (or have a cavity which extends along one side of the exposure area). Where this is the case the cooling element will cool the exposure area E either before exposure or after exposure (depending upon the scanning direction during that exposure). Alternatively, a single cooling element may for example extend around a plurality of sides of the exposure area (e.g. have a cavity or floor with openings which extends around a plurality of sides of the exposure area). A single cooling element may for example extend around a perimeter of the exposure area (e.g. have a cavity or floor with openings which extends around the perimeter of the exposure area).

In an alternative example more than two cooling elements may be provided. For example four cooling elements may be provided, one cooling element being provided adjacent to each edge of the exposure area.

Figure 17:
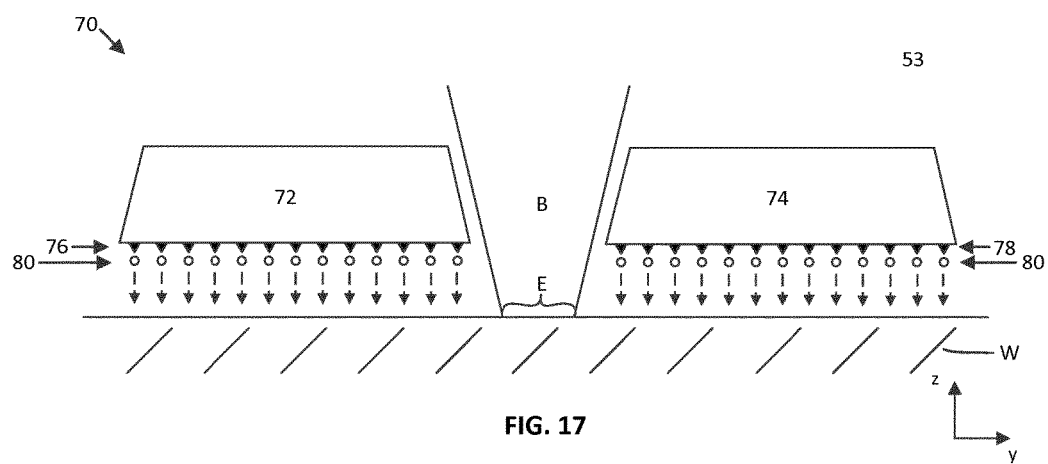
FIG. 17 schematically depicts a cooling apparatus of the lithographic apparatus according to an alternative embodiment of the invention.

An alternative embodiment of the invention is schematically depicted in FIG. 17. The cooling apparatus 70 of FIG. 17 is similar to the embodiment described above in that it comprises a pair of cooling elements 72, 74, however in this embodiment a different cooling mechanism is used to remove heat from the substrate W. Each cooling element 72, 74 is provided with an array of nozzles 76, 78 which is arranged to direct droplets of liquid onto the substrate W. The droplets of liquid are schematically depicted by circles 80 in FIG. 17. The liquid may be water, and the embodiment of FIG. 17 is described in connection with water droplets being used. However, any other suitable liquid may be used. The droplets of water receive heat from the substrate W and evaporate from the surface of the substrate. The transfer of heat to the water droplets and the evaporation of the droplets provides cooling of the substrate W. Evaporation of the droplets from a region of the substrate W which is being cooled may be completed before that region is illuminated by the radiation beam B.

The nozzle arrays 76, 78 may be two-dimensional arrays. The nozzles may for example be provided as rectangular arrays (e.g. with the nozzles having a rectangular grid-like arrangement). Each nozzle array 76, 78 may have any suitable arrangement. The nozzles may be evenly distributed across each array 76, 78. The nozzles may be arranged to provide an even distribution of water droplets on the substrate W.

The considerations set out further above regarding the positioning of the cooling elements 42, 44 of the previously described embodiment generally apply in connection with the positioning of the cooling elements 70, 72 of this embodiment. Thus, for example, the cooling elements 72, 74 are located either side of the radiation beam B in the scanning-direction (i.e. in the Y-direction). The cooling elements 72, 74 are adjacent to an exposure area E. In this context the term "adjacent" may be interpreted as meaning less than 1 cm from an edge of the exposure area E. The cooling elements 72, 74 may be less than 0.5 cm from an edge of the exposure area E, and may be around 0.1 cm from an edge of the exposure area. Each cooling element may be configured to cool an area which lies within 3 cm or less from a line which bisects the exposure area E. Each cooling element may be configured to cool an area which lies within 2 cm or less from an edge of the exposure area.

For the reasons explained further above, the extent of a nozzle array in the Y-direction may be equal to or greater than the maximum exposure area length of the lithographic apparatus in the Y-direction. A nozzle array may for example be configured to deliver water droplets to an area which extends around 26 mm in the X-direction. Each nozzle array may for example be configured to deliver water droplets to an area which extends around 5 mm in the Y-direction.

The separation between a bottom surface of each cooling element 72, 74 (which may be taken as being the bottom surfaces of the nozzles 76, 78) may be significantly larger than in the embodiment described further above because different considerations apply. Some evaporation of the water droplets will occur as the water droplets travel from the nozzles 76, 78 to the substrate W. However, provided that the water droplets are not fully vaporized before they reach the substrate W, the water droplets will provide some cooling of the substrate. The amount of evaporation of water droplets which occurs will depend upon the time of flight of the water droplets, and this in turn will depend upon the speed of the water droplets and the separation between the cooling elements 72, 74 and the substrate W. A separation of a millimeter or more (e.g. up to around 5 mm) may for example be provided without causing a problematic amount of water droplet evaporation (e.g. evaporation during travel to the substrate W may be around 50% or less and may be less than 10%). A smaller separation may be provided, for example 50 microns or more. As noted further above, a separation of 50 microns may be sufficient to substantially eliminate the risk of contact between the cooling elements 72, 74 and the substrate W.

The proportion of a water droplet which evaporates during a given time will depend upon the radius of the water droplet. The water droplets of embodiments of the invention may for example have a diameter of the order of microns or tens of microns. For example, the water droplets may have a diameter of around 20 microns. Where this is the case the time taken for half of a water droplet to evaporate may be around 5 ms. The nozzles 76, 78 may direct water droplets towards the substrate at a speed of around 10 m/s. If the separation between the nozzles and the substrate is 5 mm then around 6% of the water droplet will evaporate before it reaches the substrate W. If less evaporation is desired or a lower droplet speed is desired then the separation between the cooling elements 72, 74 and the substrate W may be reduced accordingly. For example, reducing the separation to 100 microns will allow droplets to be delivered at the same speed with round 0.1% evaporation.

Each cooling element 72, 74 may be arranged to remove around 1.5-3 W from the substrate. The evaporation energy of water is $2 \times 10^6$ J/kg. Thus, in order for example to remove 2 W from the substrate, water droplets may be delivered to the substrate at a rate of around 1 mg/s.

Although the embodiment described in connection with FIG. 17 comprises two cooling elements 72, 74 other embodiments of the invention may comprise other numbers of cooling elements. For example, a single cooling element may be provided. The single cooling element may for example have a nozzle array which extends along one side of the exposure area E. Where this is the case the cooling element will cool the exposure area either before exposure or after exposure (depending upon the scanning direction during that exposure). Alternatively, a single cooling element may for example extend around a plurality of sides of the exposure area (e.g. have a nozzle array which extends around a plurality of sides of the exposure area). A single cooling element may for example extend around a perimeter of the exposure area (e.g. have a nozzle array which extends around the perimeter of the exposure area).

In an alternative example more than two cooling elements may be provided. For example four cooling elements may be provided, one cooling element being provided adjacent to each edge of the exposure area.

It will be appreciated that, where appropriate, variations described further above in connection with the previously described embodiment may also be applied to the currently described embodiment.

Although the described embodiment uses water droplets, any other suitable liquid which will evaporate from a substrate may be used. For example, $CO_2$, $H_2$, or inert gas held at sufficiently high pressure and/or a sufficiently low temperature to be in liquid form may be ejected from the nozzle array.

Figure 18A:
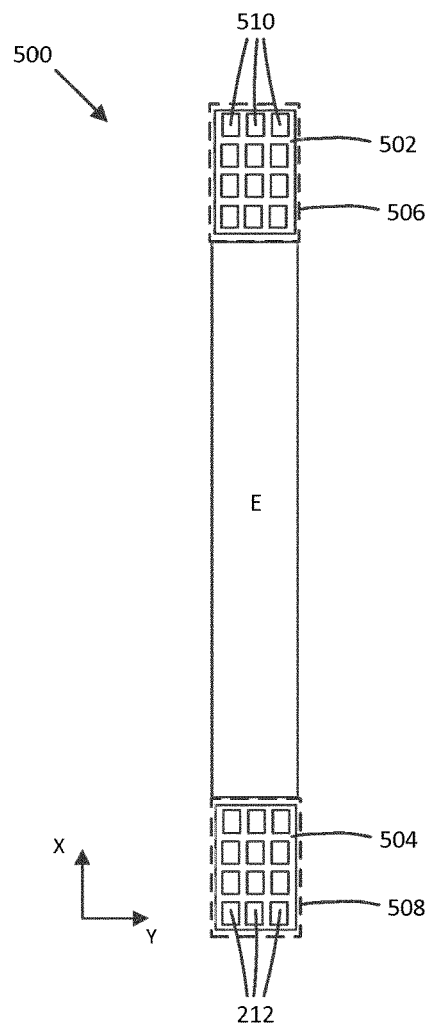
FIGS. 18A-18B schematically depict a heating apparatus of the lithographic apparatus according to an embodiment of the invention.
Figure 18B:
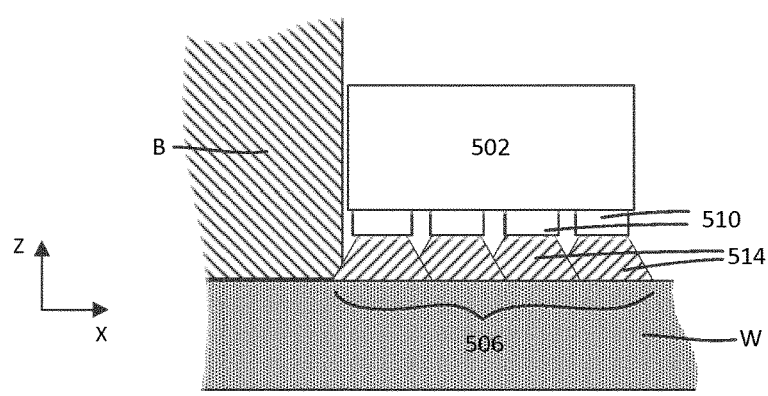

An alternative embodiment of the invention comprises a heating apparatus. FIGS. 18-22 schematically depict an embodiments of the heating apparatus and show how the heating apparatus may be used. FIG. 18A is a schematic view of a heating apparatus 200 viewed from below, and FIG. 18B is a schematic view from one side of a heating element 202 of the heating apparatus. The radiation beam B projected by the lithographic apparatus is shown in FIG. 18B, and the exposure area E illuminated by the radiation beam is shown in FIG. 18A.

In common with other illustrated embodiments, Cartesian coordinates are shown in FIGS. 18-22 and use the conventional notation for lithographic apparatus, i.e. the Y-direction is the direction of scanning movement of the substrate W during exposure, the X-direction is transverse to the Y-direction and lies in the plane of the substrate, and the Z-direction generally corresponds with the optical axis of the radiation beam B.

The heating apparatus 200 comprises a first heating element 502 and a second heating element 504. As depicted in FIG. 18A the first and second heating elements 502, 504 may have the same overall construction. The heating elements 502, 504 are located at opposite ends of the exposure area E in the non-scanning direction (i.e. in the X-direction). The heating elements 502, 504 may be adjacent to the exposure area E. In this context the term "adjacent" may be interpreted as meaning less than 1 cm from an edge of the exposure area E. The cooling elements 502, 504 may be less than 0.5 cm from an edge of the exposure area E, and may be around 0.1 cm from an edge of the exposure area.

Each heating element 502, 504 provides localized heating of the substrate W in an area which lies directly beneath that heating element. The area which is heated by each heating element 502, 504 may also extend beyond the area which is located directly beneath that heating element. The heated area is schematically depicted in FIG. 18A by dotted lines 506, 508. Each heating element 502, 504 comprises an array of LEDs 510, 512 which are configured to emit infrared radiation. Although the depicted arrays of LEDs 510, 512 each comprise twelve LEDs, any suitable number of LEDs may be used.

FIG. 18B depicts one of the heating elements 502 viewed from one side. As may be seen, the LEDs 510 emit infrared radiation beams 514. The infrared radiation beams 514 diverge and thus illuminate an area 506 on the substrate W which extends beyond the footprint of the heating element 502. As is schematically depicted in FIG. 18B, at least one of the infrared radiation beams 514 may overlap with an edge of the radiation beam B. Thus, the heating apparatus 200 may heat an area which overlaps with the exposure area E.

In general, a heat emitter of a heating element 502, 504 may be configured to emit heat with some outward divergence such that the area 506, 508 on the substrate which receives heat extends beyond the footprint of the heating element.

The heating element 502 delivers localized heating to the substrate W which acts to heat the portion of the substrate which is immediately outside of the edge of the exposure area E (in the X-direction) illuminated by the radiation beam B. As a result, the temperature of the substrate W does not drop off rapidly at the edge of the exposure area E, but instead reduces more slowly. This is advantageous because distortion of the substrate which would otherwise be caused by such a temperature drop is reduced. This enables an improvement of the accuracy with which a pattern may be projected onto the substrate W by the lithographic apparatus LA (it may provide an improvement of the overlay performance of the lithographic apparatus).

Figure 19:
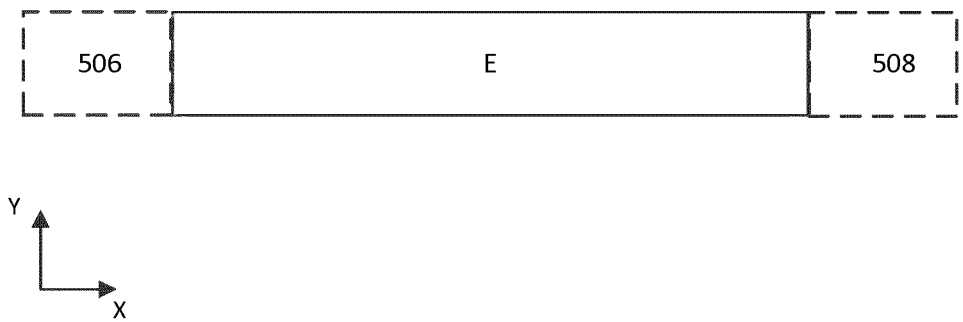
FIG. 19 schematically depicts the effect of the heating apparatus shown in FIG. 18.

FIG. 19 schematically depicts the exposure area E which is exposed by the radiation beam B of a lithographic apparatus, and in addition schematically depicts the areas 506, 508 which are heated by the heating elements of the heating apparatus. As may be seen in FIG. 19, one of the heated areas 506 adjoins the exposure area E on one side in the X-direction of the exposure area, and the other heated area 508 adjoins the exposure area E on the opposite side in the X-direction. As has been mentioned above, the heating elements heat the substrate such that thermal gradients which would otherwise be present at the X-direction edges of the exposure area E are not present (or are reduced). Instead, those thermal gradients are moved outwards in the X-direction to edges of the heated areas 506, 508 which are distal from the exposure area E. Since these edges are not being exposed by the radiation beam B, the presence of thermal gradients at those edges does not have a significant effect upon the accuracy with which patterns are projected onto the substrate W.

In an embodiment, the heated areas 506, 508 may overlap with X-direction edges of the exposure area E. Although the exposure area E is depicted as having a sharp edge, in practice it may have a blurred edge as the intensity of the radiation beam B decreases in the X-direction. Similarly, the heated areas 506, 508, although depicted with sharp edges, may have blurred edges where the heat provided by the infrared radiation beams 514 drops off gradually in the X-direction. The heating elements 502, 504 may be configured such that blurred edges in the X-direction of the heated areas 506, 508 overlap with blurred edges of the exposure area E. Thus, there may be a gradual transition in the X-direction from an area which is heated by the radiation beam B to an area which is heated by a heating element 502, 504.

The heating elements 502, 504 may be configured to emit infrared radiation (as noted above) because infrared radiation is not actinic for lithographic resist. Other non-actinic wavelengths of radiation may be emitted by the heating elements 502, 504. Although the illustrated embodiment uses LEDs 510, 512 to provide radiation beams 514 which deliver heat to the substrate W, any suitable form of heat emitter may be used to emit heat onto the substrate. The heating area may also have a size in the scanning direction that is larger than that of the exposure area. The heating in the heating area does not need to be uniform.

The heating apparatus 500 may be mounted on a housing of the projection system PS. This may for example be done in a manner which generally corresponds with the mounting of the cooling apparatus 40 schematically depicted in FIG. 1. The cooling areas may be larger in X-direction when heating is applied, i.e. they may extend until the width in X-direction until features 206+E+208 of FIG. 18.

Figure 20:
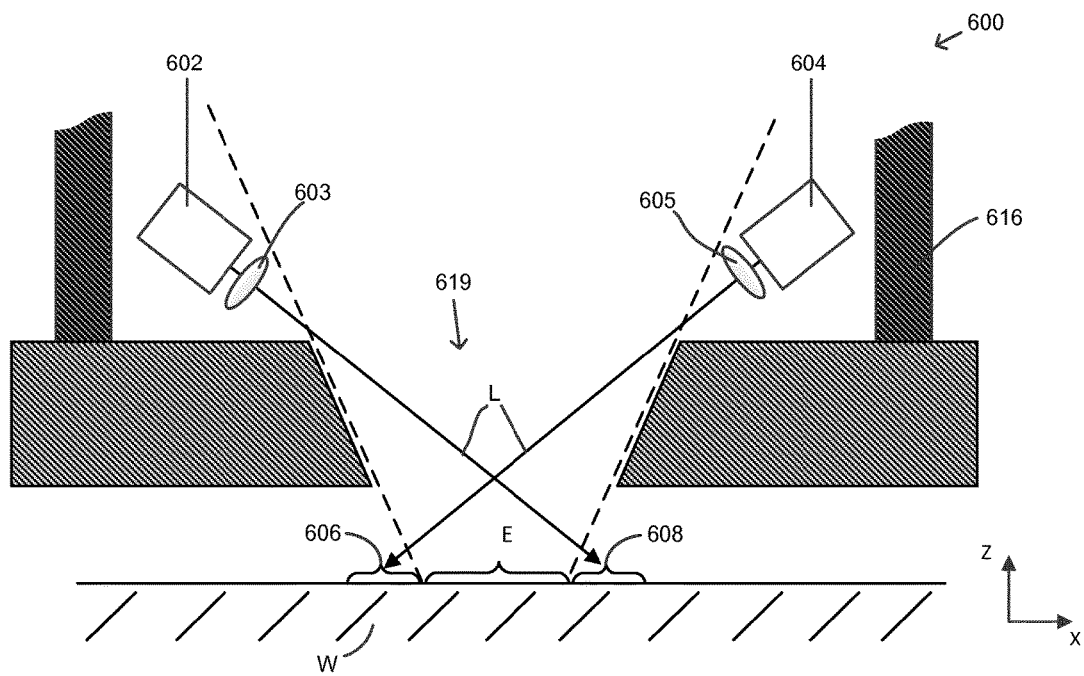
FIG. 20 schematically depicts a heating apparatus of the lithographic apparatus according to an alternative embodiment of the invention.
Figure 21:
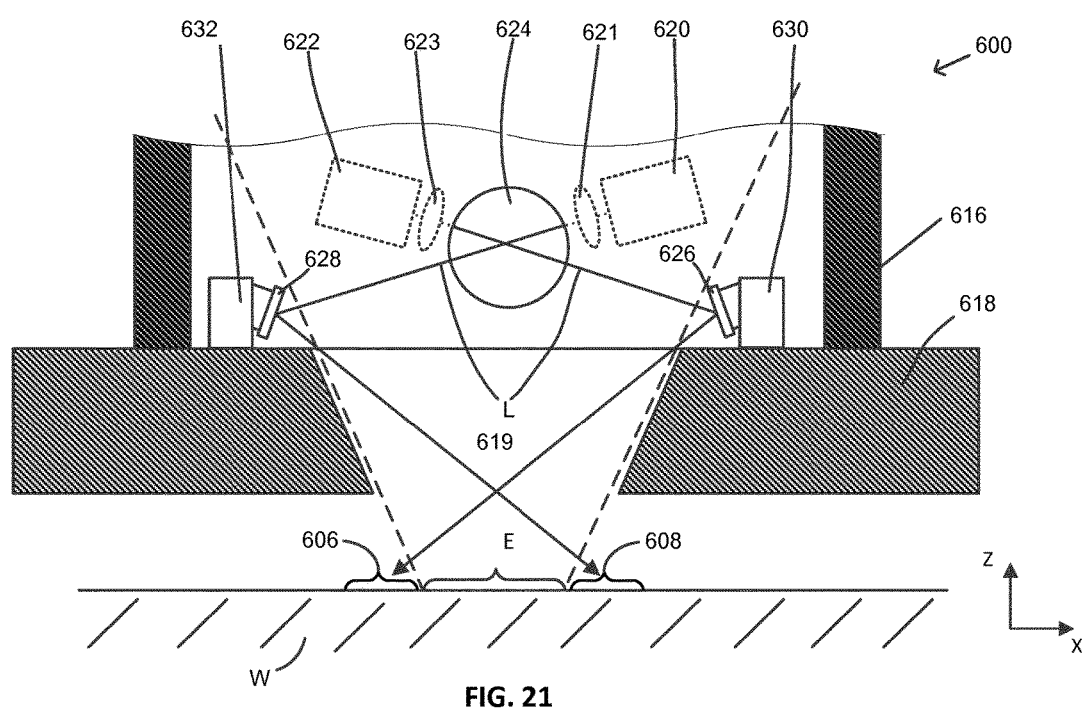
FIG. 21 schematically depicts a heating apparatus of the lithographic apparatus according to a further alternative embodiment of the invention.

FIGS. 20 and 21 schematically depict alternative embodiments of a heating apparatus which may be used instead of the heating apparatus depicted in FIG. 18. Referring first to FIG. 20, the heating apparatus 600 comprises a first laser 602 and a second laser 604 which are configured to output laser beams L that are incident upon a substrate W. The laser beams L illuminate areas 606, 608 on either side of the exposure area E which is illuminated by the radiation beam B of the lithographic apparatus. The illuminated areas 606, 608 may adjoin the exposure area E. The lasers 602, 604 are examples of heating elements.

The laser beams L illuminate areas 606, 608 on the substrate W which generally correspond with the areas 506, 608 depicted in FIG. 19. The shape and size of these areas may be determined by optics 603, 605. The optics 603, 605 may include mirrors which are used to direct the laser beams onto the substrate W. The laser beams L may for example be infrared laser beams. The laser beams L may have some other non-actinic wavelength. The laser beams L deliver localized heating to the substrate W which acts to heat the portion of the substrate which is immediately outside of the edge of the exposure area E (in the X-direction) illuminated by the radiation beam B. As a result, the temperature of the substrate W does not drop off rapidly at the edge of the exposure area E, but instead reduces more slowly. This provides the advantage that distortion of the substrate which would otherwise be caused by such a temperature drop is reduced. This in turn provides an improvement of the accuracy with which a pattern may be projected onto the substrate W by the lithographic apparatus LA (it may provide an improvement of the overlay performance of the lithographic apparatus). This is explained in more detail further above in connection with FIG. 19.

Areas 606, 608 on the substrate W which are illuminated by the laser beams L may overlap with X-direction edges of the exposure area E. The exposure area E may have a blurred edge at which the intensity of the radiation beam B decreases in the X-direction. Similarly, areas 606, 608 which are illuminated by the laser beams L may have blurred edges where the intensity of the laser beams decreases in the X-direction. The laser beams L may be positioned such that blurred edges in the X-direction of the areas 606, 608 illuminated by the laser beams overlap with blurred edges of the exposure area E. Thus, there may be a gradual transition in the X-direction from an area E which is heated by the radiation beam B of the lithographic apparatus to areas 606, 608 which are heated by the laser beams L.

The laser beams L travel out through an opening 619 in a floor 618 of the projection system housing. The opening 619 is provided primarily to allow the radiation beam B of the lithographic apparatus to exit the projection system housing and be incident upon the substrate W. However, the laser beams L also make use of the opening 619. The laser beams L may for example cross over each other (e.g. in the X-direction) as schematically depicted in FIG. 20.

The lasers 602, 604 may be provided within a housing 616 of the projection system PS of the lithographic apparatus (see FIG. 1). The environment within the housing may be a vacuum environment, and lasers suitable for use in a vacuum environment may be selected (e.g. lasers which do not suffer from significant outgassing). In an alternative approach lasers may be located outside of the housing 618 of the projection system with laser beams passing through one or more windows provided in a wall of the projection system housing. This is schematically depicted in FIG. 21.

Referring to FIG. 21, an embodiment of the heating apparatus 600 is depicted which is configured to operate in a manner that corresponds with that described above in connection with FIG. 20, but in which lasers 620, 622 are located outside of the housing 616 of the projection system. The lasers 620, 622 may be considered to be examples of heating elements. The lasers 620, 622 may be located remotely from the housing 618 and provide laser beams L which travel from those remote locations to the projection system housing 616. A window 624 is provided in the projection system housing 616. The window 624 may for example be formed from quartz or some other suitable material, and is substantially transparent at the wavelength of the laser beams L. Mirrors 626, 628 located within the projection system housing 618 are configured to receive and reflect the laser beams L. The mirrors 626, 628 are oriented to direct the laser beams L onto the substrate W on either side (in the X-direction) of the exposure area E. The laser beams L thus illuminate areas 606, 608 either side of the exposure area E (e.g. adjoining the exposure area). The shape and size of the illuminated areas 606, 608 may be determined by optics 621, 623 located downstream of the lasers 620, 622.

The mirrors 626, 628 are held by mountings 630, 632. The mountings may be fixed such that the orientations of the mirrors 626, 628 are fixed. Alternatively, the mountings 630, 632 may include actuators which are configured to adjust the orientations of the mirrors 626, 628. The actuators may be controlled by a controller (not depicted). If actuators are provided then these actuators may be used to change the positions at which the laser beams L are incident upon the substrate W. This positional adjustment may be used for example if an exposure area E with a reduced X-direction dimension is selected by an operator of the lithographic apparatus. Advantageously, this may ensure that the areas 606, 608 illuminated by the laser beams L continue to adjoin edges of the exposure area E.

Mirrors on actuators may be provided at any suitable locations, and may be used to control the positions of the illuminated areas 606, 608 on the substrate W.

Although the embodiments of FIGS. 20 and 21 have two lasers, any suitable number of lasers may be used. For example, a single laser may be used to provide a single laser beam which is then split into two beams (e.g. using a beam splitter), so that a first laser beam can illuminate one substrate area 606 and the other laser beam can illuminate the second substrate area 608.

The Y-direction extent of the areas 506, 508, 606, 608 illuminated by the heating apparatus 500, 600 may generally correspond with the Y-direction extent of the exposure area E illuminated by the radiation beam B. This is advantageous because it allows the heating apparatus to deliver heat at either end of the exposure area E in a manner which corresponds with the manner with which heat is delivered by the radiation beam B.

The heating elements of the heating apparatus 500, 600 may be switched off when the radiation beam B is not incident upon the substrate W. This may occur for example when the substrate W is being moved after exposure of a target portion and before exposure of the next target portion. This is advantageous because there is no benefit to be had using the heating apparatus 500, 600 to heat the substrate W when the radiation beam B is not heating the substrate.

Figure 22:
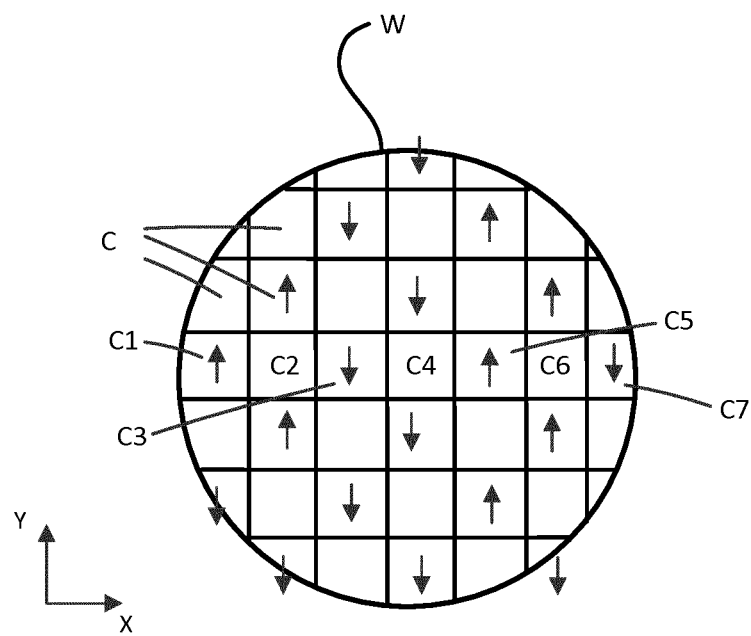
FIG. 22 schematically depicts scanning exposure of a substrate using the embodiment depicted in FIGS. 18 to 21.

FIG. 22 schematically depicts a substrate W divided up into an array of target portions C. In a conventional scanning exposure of a substrate W a meander path is used in which adjacent target portions C of the substrate in the X-direction are exposed in series. When a heating apparatus 500, 600 according to an embodiment of the invention is used a different form of meander path may be used in which adjacent target portions in the X-direction are not exposed. Instead, target portions separated in the X-direction by at least one interposed target portion may be exposed. An example of this is schematically depicted in FIG. 22. In FIG. 22 the arrows depict the direction of scanning exposure of the target portions. Thus, referring to the labelled row of target portions, C1 is exposed by a scanning exposure in the +Y-direction, then C3 is exposed by a scanning exposure in the −Y-direction. C2 is not exposed because it has received heat from the heating apparatus 500, 600 and thus may include some localised distortion. C5 is then exposed by a scanning exposure in the +Y-direction, following which C7 is exposed by a scanning exposure in the −Y-direction. C4 and C6 are not exposed because they have received heat from the heating apparatus 500, 600 and may include some localised distortion.

Once all of the target portions which include arrows in FIG. 22 have been exposed, the other target portions may be exposed. This approach is advantageous because it allows time for heat which has been delivered to target portions by the heating apparatus 500, 600 to dissipate before those target portions are exposed using the lithographic apparatus.

The X-direction extent of the heated areas 506, 508, 606, 608 may be less than the X-direction extent of the exposure area E. This is advantageous because it avoids a given heating element heating multiple target portions at the same time. Referring to FIG. 22, it will be appreciated that if a heated area 506, 508, 606, 608 extended by more than the X-direction extent of the exposure area then, for example, target portion C3 would be heated during exposure of target portion C1. This heating would cause unwanted distortion of target portion C3 that would be present during exposure of target portion C3.

The X-direction extent of each heated area 506, 508, 606, 608 may be less than half the X-direction extent of the exposure area E.

The heating apparatus 500, 600 may be used in combination with the cooling apparatus 40 described further above. The combined use of a cooling apparatus 40 and a heating apparatus 500, 600 might be expected to provide no net benefit because the effect of the cooling apparatus would cancel out the effect of the heating apparatus. However, this is not the case. The cooling apparatus 40 and the heating apparatus 500, 600 may be provided at different positions relative to the exposure area E to obtain different beneficial effects. Thus, for example, the heating elements 502, 504 of the heating apparatus 500 may be provided at X-direction ends of the exposure area E in order to reduce distortion arising at edges of the exposure area. This distortion, which may be referred to as an edge effect, is not a significant issue at the Y-direction edges of the exposure area E. This is because the scanning movement of the substrate W relative to the exposure area E averages the radiation delivered to the substrate W in the Y-direction such that edge effects do not arise. Thus, providing the cooling apparatus 40 at Y-direction edges of the exposure area E will provide the advantageous effects described further above without causing edge effects at the Y-direction edges. Therefore, the heating apparatus 500 may be provided at X-direction ends of the exposure area E and the cooling apparatus 40 may be provided at at least one Y-direction end of the exposure area. The heating apparatus 500 and the cooling apparatus 40 may be connected together to form a single unit.

References to the surface of the substrate in this document may be interpreted as referring to the surface of resist provided on the substrate.

As has been noted above, slipping of the substrate W over the surface of burls of the substrate table WT may reduce the accuracy with which a projected pattern is aligned with a previously projected pattern (generally referred to as overlay). Using above described embodiments may reduce or prevent slipping of a substrate W over burls. Additionally or alternatively, slipping of a substrate W over burls may be reduced or prevented by heating the substrate to a temperature which is above the temperature of the substrate table WT upon which it will be placed. For example, the substrate W may be heated by a temperature adjustment unit AU (see FIG. 1) to a temperature which is around 100 mK higher than the temperature of the substrate table WT. The temperature adjustment unit AU may comprise a plate which is held at the desired temperature. When the substrate W is placed onto the plate it is heated to the temperature of the plate. The heated substrate W is then placed onto the substrate table WT and a clamped to the substrate table using a clamp which forms part of the substrate table (e.g. an electrostatic clamp). The substrate then cools to the temperature of the substrate table, thereby introducing a stress into the substrate. The stress which is introduced into the substrate tends to draw an outer edge of the substrate inwards towards the centre of the substrate. When the substrate is patterned using the radiation beam B this heats the substrate and introduces stress which tends to push an outer edge of the substrate outwards away from the centre of the substrate. The stress already introduced during cooling of substrate will at least partially counteract the stress caused by heating of the substrate, thereby reducing the cumulative stress experienced by the substrate. This is particularly the case in the vicinity of the outer edge of the substrate. The reduction of cumulative stress reduces or prevents slippage of the substrate W over burls of the substrate table WT, particularly in the vicinity of the outer edge of the substrate. This is advantageous because slippage is most likely to occur in the vicinity of the outer edge of the substrate (the clamp may apply less force in the vicinity of the outer edge of the substrate than at other locations).

Although in the above example the temperature adjustment unit AU heats the substrate by 100 mK, the temperature adjustment unit may heat the substrate by other amounts. For example, the temperature adjustment unit may heat the substrate by up to around 0.5K.

In schematic illustrations of embodiments of the invention the exposure area E is depicted as a rectangle. This is for ease of illustration, and it will be appreciated that the exposure area E may have some other shape. The exposure area E may for example include some curvature along the X-direction (e.g. it may have a shape which generally resembles a banana).

In an embodiment, the invention may form part of a mask inspection apparatus. The mask inspection apparatus may use EUV radiation to illuminate a mask and use an imaging sensor to monitor radiation reflected from the mask. Images received by the imaging sensor are used to determine whether or not defects are present in the mask. The mask inspection apparatus may include optics (e.g. mirrors) configured to receive EUV radiation from an EUV radiation source and form it into a radiation beam to be directed at a mask. The mask inspection apparatus may further include optics (e.g. mirrors) configured to collect EUV radiation reflected from the mask and form an image of the mask at the imaging sensor. The mask inspection apparatus may include a processor configured to analyse the image of the mask at the imaging sensor, and to determine from that analysis whether any defects are present on the mask. The processor may further be configured to determine whether a detected mask defect will cause an unacceptable defect in images projected onto a substrate when the mask is used by a lithographic apparatus.

In an embodiment, the invention may form part of a metrology apparatus. The metrology apparatus may be used to measure alignment of a projected pattern formed in resist on a substrate relative to a pattern already present on the substrate. This measurement of relative alignment may be referred to as overlay. The metrology apparatus may for example be located adjacent to a lithographic apparatus and may be used to measure the overlay before the substrate (and the resist) has been processed.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm.

Although FIGS. 1 and 2 depict the radiation source SO as a laser produced plasma LPP source, any suitable source may be used to generate EUV radiation. For example, EUV emitting plasma may be produced by using an electrical discharge to convert fuel (e.g. tin) to a plasma state. A radiation source of this type may be referred to as a discharge produced plasma (DPP) source. The electrical discharge may be generated by a power supply which may form part of the radiation source or may be a separate entity that is connected via an electrical connection to the radiation source SO.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A lithographic apparatus comprising:
   a projection system configured to project a patterned radiation beam to form an exposure area on a substrate held on a substrate table; and
   a cooling apparatus configured to cool the substrate, wherein the cooling apparatus comprises a cooling element located above the substrate table and adjacent to the exposure area, the cooling element being configured to remove heat from a substrate held on the substrate table,
   wherein the cooling element comprises a body, an open cavity being provided in a lowermost face of the body, and a gas delivery conduit configured to deliver gas to the cavity.

2. The lithographic apparatus of claim 1, wherein the cooling element is configured to cool an area which lies within 3 cm or less from a line which bisects the exposure area.

3. The lithographic apparatus of claim 1, wherein the cooling element is configured to cool an area which lies within 2 cm or less from an edge of the exposure area.

4. The lithographic apparatus of claim 1, wherein the cooling element is separated from the exposure area in a direction which substantially corresponds with a scanning direction of the lithographic apparatus.

5. The lithographic apparatus of claim 1, wherein the cooling element is one of a pair of cooling elements provided on either side of the exposure area.

6. The lithographic apparatus of claim 1, wherein the cavity is configured to form, together with an upper surface of the substrate, a volume which receives gas delivered by the gas delivery conduit.

7. The lithographic apparatus of claim 1, wherein an extent of the cavity of the cooling element in a non-scanning direction of the lithographic apparatus is equal to or greater than a maximum exposure area length of the lithographic apparatus in the non-scanning direction.

8. The lithographic apparatus of claim 1, wherein the cavity has a roof which is less than 1 mm from the upper surface of the substrate in use.

9. The lithographic apparatus of claim 8, wherein a combination of pressure of gas delivered to the cavity and a separation between the roof and the substrate surface is such that an accommodation coefficient of the substrate does not have a significant effect upon transfer of heat from the substrate to the cooling element body.

10. The lithographic apparatus of claim 1, wherein the roof of the cavity is substantially parallel to a plane of the substrate table.

11. The lithographic apparatus of claim 1, wherein a roof of the cavity is sloping, the roof being tilted about an axis which runs transverse to a scanning direction of the lithographic apparatus.

12. The lithographic apparatus of claim 1, wherein the body of the cooling element contains a chamber connected to the gas delivery conduit, a floor of the chamber being provided with openings.

13. The lithographic apparatus of claim 1, wherein the lithographic apparatus further comprises a gas supply configured to deliver gas to the cooling element at a pressure of 200 Pascals or more.

14. A lithographic method comprising:
   projecting a patterned radiation beam to form an exposure area on a substrate held on a substrate table, and
   using a cooling apparatus to cool the substrate, the cooling apparatus comprising a cooling element located above the substrate table and adjacent to the exposure area, wherein the cooling element removes heat from the substrate, wherein the cooling element comprises a body, an open cavity being provided in a lowermost face of the body, and a gas delivery conduit configured to deliver gas to the cavity.

* * * * *